US012362732B2

(12) United States Patent
Inoue et al.

(10) Patent No.: US 12,362,732 B2
(45) Date of Patent: Jul. 15, 2025

(54) SEMICONDUCTOR DEVICE AND DRIVING METHOD THEREOF

(71) Applicant: Semiconductor Energy Laboratory Co., Ltd., Kanagawa-ken (JP)

(72) Inventors: Hiroki Inoue, Kanagawa (JP); Seiichi Yoneda, Kanagawa (JP); Yusuke Negoro, Osaka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 17/779,675

(22) PCT Filed: Nov. 16, 2020

(86) PCT No.: PCT/IB2020/060736
§ 371 (c)(1),
(2) Date: May 25, 2022

(87) PCT Pub. No.: WO2021/105814
PCT Pub. Date: Jun. 3, 2021

(65) Prior Publication Data
US 2022/0416767 A1    Dec. 29, 2022

(30) Foreign Application Priority Data

Nov. 29, 2019 (JP) .................................. 2019-217188

(51) Int. Cl.
*H03K 3/01* (2006.01)
*H03K 3/011* (2006.01)
(Continued)

(52) U.S. Cl.
CPC ............. *H03K 3/011* (2013.01); *H03K 17/56* (2013.01); *H10F 39/80377* (2025.01);
(Continued)

(58) Field of Classification Search
CPC ............... H03K 5/1254; H03K 5/2481; H03K 5/15073; H03K 2005/00156
See application file for complete search history.

(56) References Cited

U.S. PATENT DOCUMENTS 5,121,003 A * 6/1992 Williams ........... H03K 19/0966
365/189.04
5,382,844 A * 1/1995 Knauer .............. H03K 19/1738
326/50
(Continued)

FOREIGN PATENT DOCUMENTS

JP    2004-349814 A    12/2004
JP    2007-026670 A    2/2007
(Continued)

OTHER PUBLICATIONS

International Search Report (Application No. PCT/IB2020/060736), dated Mar. 9, 2021.
(Continued)

Primary Examiner — Quan Tra
(74) Attorney, Agent, or Firm — Husch Blackwell LLP

(57) ABSTRACT

A semiconductor device with a small circuit scale is provided. The semiconductor device includes a first circuit and a second circuit. The first circuit includes first to n-th (n is an integer of 2 or more) transistors and the second circuit includes (n+1)-th to 2n-th transistors. The first to n-th transistors are connected in parallel to each other and the (n+1)-th to 2n-th transistors are connected in series to each other. First to n-th signals are supplied to the first circuit and the second circuit. The first circuit has a function of outputting a first potential when each of potentials of the first to n-th signals is lower than or equal to a first reference potential, and outputting a second potential when at least one of the potentials of the first to n-th signals is higher than the first reference potential. The second circuit has a function of
(Continued)

outputting a third potential when each of the potentials of the first to n-th signals is higher than a second reference potential, and outputting the first potential when at least one of the potentials of the first to n-th signals is lower than or equal to the second reference potential.

14 Claims, 21 Drawing Sheets

(51) Int. Cl.
| | | |
|---|---|---|
| *H03K 17/56* | (2006.01) | |
| *H10F 39/00* | (2025.01) | |
| *H04N 25/77* | (2023.01) | |
| *H10D 30/67* | (2025.01) | |

(52) U.S. Cl.
CPC ......... *H04N 25/77* (2023.01); *H10D 30/6734* (2025.01); *H10D 30/6755* (2025.01)

(56) References Cited

U.S. PATENT DOCUMENTS

| | | | | |
|---|---|---|---|---|
| 5,479,107 | A * | 12/1995 | Knauer | H03K 19/0963 326/119 |
| 6,133,761 | A * | 10/2000 | Matsubara | G06F 7/5375 326/112 |
| 6,177,831 | B1 * | 1/2001 | Yoneda | G11C 5/146 327/543 |
| 6,333,645 | B1 * | 12/2001 | Kanetani | H03K 19/0963 326/98 |
| 6,987,724 | B2 | 1/2006 | Kim et al. | |
| 7,391,704 | B2 | 6/2008 | Kim et al. | |
| 7,586,334 | B2 * | 9/2009 | Manfred | H03K 19/00 326/108 |
| 7,688,117 | B1 * | 3/2010 | Krasowski | H03K 19/094 326/119 |
| 8,184,520 | B2 | 5/2012 | Kim et al. | |
| 8,791,717 | B2 * | 7/2014 | Chang | H03K 19/0008 326/26 |
| 9,450,581 | B2 | 9/2016 | Tamura | |
| 9,762,239 | B2 | 9/2017 | Tamura | |
| 10,205,452 | B2 | 2/2019 | Tamura | |
| 2004/0025074 | A1 * | 2/2004 | Singh | G06F 9/3869 713/400 |
| 2007/0171803 | A1 | 7/2007 | Kim et al. | |
| 2007/0229145 | A1 * | 10/2007 | Kapoor | H03K 19/0963 257/E27.033 |
| 2013/0166993 | A1 * | 6/2013 | Lee | G11C 29/40 714/799 |
| 2017/0005659 | A1 * | 1/2017 | Tamura | H01L 29/7869 |
| 2019/0007638 | A1 * | 1/2019 | Ishibashi | H04N 25/75 |
| 2023/0075180 | A1 | 3/2023 | Inoue et al. | |

FOREIGN PATENT DOCUMENTS

| | | |
|---|---|---|
| JP | 2012-165193 A | 8/2012 |
| JP | 2014-179777 A | 9/2014 |
| JP | 2016-072982 A | 5/2016 |

OTHER PUBLICATIONS

Written Opinion (Application No. PCT/IB2020/060736), dated Mar. 9, 2021.

Chi, Y. et al., "CMOS Camera With In-Pixel Temporal Change Detection and ADC," Journal of Solid-State Circuits, Sep. 24, 2007, vol. 42, No. 10, pp. 2187-2196, IEEE.

Kumagai, O. et al., "A 1/4-inch 3.9Mpixel Low-Power Event-Driven Back-Illuminated Stacked CMOS Image Sensor," ISSCC 2018 (Digest of Technical Papers. IEEE International Solid-State Circuits Conference), Feb. 11, 2018, pp. 86-87.

* cited by examiner

FIG. 12A
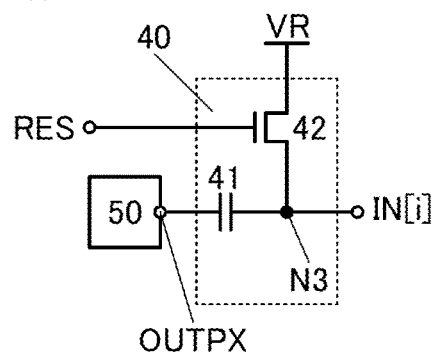
FIG. 12B1
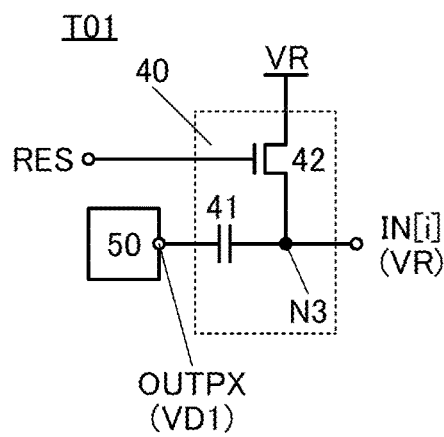
FIG. 12B2
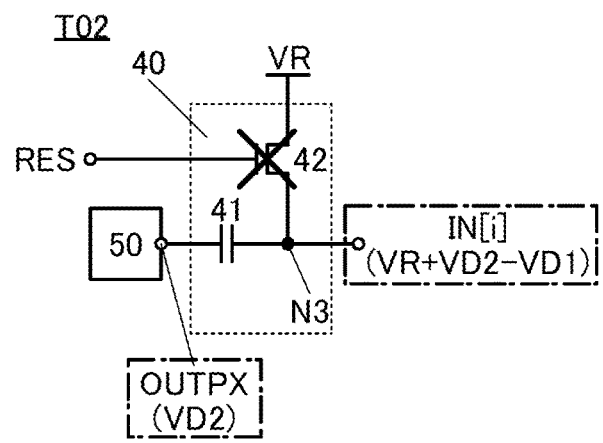

FIG. 19A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 19B
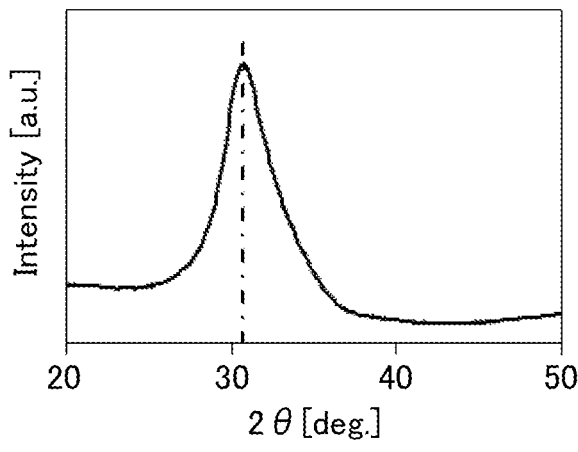
FIG. 19C
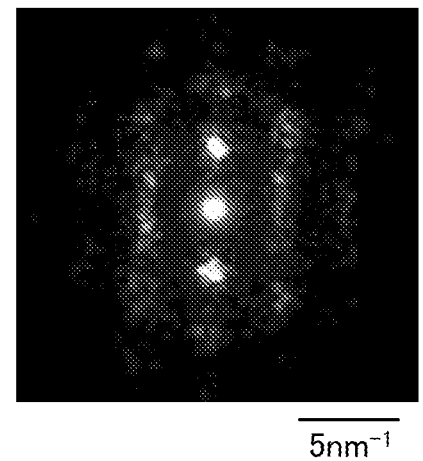

SEMICONDUCTOR DEVICE AND DRIVING METHOD THEREOF

This application is a 371 of international application PCT/IB2020/060736 filed on Nov. 16, 2020 which is incorporated herein by reference.

TECHNICAL FIELD

One embodiment of the present invention relates to a semiconductor device and a driving method thereof.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a storage device, a signal processing device, a processor, an electronic device, a system, a driving method thereof, a manufacturing method thereof, and a testing method thereof.

Note that in this specification and the like, a semiconductor device means every device that can function by utilizing semiconductor characteristics. In some cases, it can be said that a display device (a liquid crystal display device, a light-emitting display device, or the like), a projection device, a lighting device, an electro-optical device, a power storage device, a memory device, a semiconductor circuit, an imaging device, a signal processing device, a transmission/reception device, a wireless sensor, a sensor device, or the like includes a semiconductor device.

BACKGROUND ART

A semiconductor device having a function of sensing a potential level has been developed. For example, Patent Document 1 discloses a semiconductor device that senses the potential level of a signal line using a potential level sensing circuit including a comparator.

REFERENCE

Patent Document

[Patent Document 1] Japanese Translation of PCT International Application No. 2007-26670

SUMMARY OF THE INVENTION

Problems to be Solved by the Invention

In order that a comparator can have a function of sensing a potential level, a larger number of comparators are needed particularly when the potential levels of a larger number of signals are sensed. Thus, the circuit scale of a semiconductor circuit becomes larger. This increases the size and power consumption of the semiconductor device.

The comparator is generally constituted by a CMOS (Complementary Metal Oxide Semiconductor) in order to have improved gain, input voltage range, and other characteristics. That is, both an n-channel transistor and a p-channel transistor are used. Here, for example, a transistor including a metal oxide in a region where a channel is formed (hereinafter, also referred to as a channel formation region) (hereinafter, such a transistor is also referred to as an OS transistor) is an n-channel transistor. Thus, when a comparator is constituted by, for example, only an OS transistor, the characteristics of the comparator significantly degrade.

Thus, an object of one embodiment of the present invention is to provide a semiconductor device with a small circuit scale. Another object is to provide a semiconductor device constituted by transistors having the same conductivity type. Another object is to provide a small semiconductor device. Another object is to provide a semiconductor device with low power consumption. Another object is to provide a semiconductor device that can be fabricated by a simple method. Another object is to provide an inexpensive semiconductor device. Another object is to provide a semiconductor device that can output a signal at high accuracy. Another object is to provide a semiconductor device that can be driven at high temperatures. Another object is to provide a highly reliable semiconductor device. Another object is to provide a novel semiconductor device.

Another object is to provide a driving method of a semiconductor device with a small circuit scale. Another object is to provide a driving method of a semiconductor device constituted by transistors having the same conductivity type. Another object is to provide a driving method of a small semiconductor device. Another object is to provide a driving method of a semiconductor device with low power consumption. Another object is to provide a driving method of a semiconductor device that can be fabricated by a simple method. Another object is to provide a driving method of an inexpensive semiconductor device. Another object is to provide a driving method of a semiconductor device that can output a signal at high accuracy. Another object is to provide a driving method of a semiconductor device that can be driven at high temperatures. Another object is to provide a driving method of a highly reliable semiconductor device. Another object is to provide a driving method of a novel semiconductor device.

Note that the description of these objects does not preclude the existence of other objects. One embodiment of the present invention does not have to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first circuit and a second circuit. The first circuit includes first to n-th (n is an integer of 2 or more) transistors and the second circuit includes (n+1)-th to 2n-th transistors. Either sources or drains of the first to n-th transistors are electrically connected to each other and the others of the sources or the drains of the first to n-th transistors are electrically connected to each other. A source and a drain of each of the (n+1)-th to 2n-th transistors are connected in series to each other. First to n-th signals are supplied to the first circuit and the second circuit. The first circuit has a function of outputting a first potential when each of potentials of the first to n-th signals is lower than or equal to a first reference potential. The first circuit has a function of outputting a second potential when at least one of the potentials of the first to n-th signals is higher than the first reference potential. The second circuit has a function of outputting a third potential when each of the potentials of the first to n-th signals is higher than a second reference potential. The second circuit has a function of outputting the first potential when at least one of the potentials of the first to n-th signals is lower than or equal to the second reference potential.

In the semiconductor device of the above embodiment, the second potential may be a potential corresponding to the first reference potential and the third potential may be a potential corresponding to the second reference potential.

In the above embodiment, the first to 2n-th transistors may be n-channel transistors.

In the above embodiment, the second reference potential may be lower than the first reference potential.

In the above embodiment, the second potential and the third potential may be lower than the first potential.

In the above embodiment, the first to 2n-th transistors may include a metal oxide in a channel formation region.

The above embodiment may have a structure in which a (2n+1)-th transistor and a (2n+2)-th transistor are included, one of a source and a drain of the (2n+1)-th transistor is electrically connected to the first circuit, one of a source and a drain of the (2n+2)-th transistor is electrically connected to the second circuit, the second potential is supplied to the other of the source and the drain of the (2n+1)-th transistor, and the third potential is supplied to the other of the source and the drain of the (2n+2)-th transistor.

The above embodiment may have a structure in which a (2n+3)-th transistor and a (2n+4)-th transistor are included, one of a source and a drain of the (2n+3)-th transistor is electrically connected to the first circuit, one of a source and a drain of the (2n+4)-th transistor is electrically connected to the second circuit, and the first potential is supplied to the other of the source and the drain of the (2n+3)-th transistor and the other of the source and the drain of the (2n+4)-th transistor.

One embodiment of the present invention is a semiconductor device including a first circuit and a second circuit. The first circuit includes first to n-th (n is an integer of 2 or more) transistors and the second circuit includes (n+1)-th to 2n-th transistors. The first to 2n-th transistors include back gates. Either sources or drains of the first to n-th transistors are electrically connected to each other and the others of the sources or the drains of the first to n-th transistors are electrically connected to each other. A source and a drain of each of the (n+1)-th to 2n-th transistors are connected in series to each other. First to n-th signals are supplied to the first circuit and the second circuit. A first potential is supplied to the back gates of the first to n-th transistors and a second potential is supplied to the back gates of the (n+1)-th to 2n-th transistors. The first circuit has a function of outputting a third potential when each of potentials of the first to n-th signals is lower than or equal to a first reference potential. The first circuit has a function of outputting a fourth potential when at least one of the potentials of the first to n-th signals is higher than the first reference potential. The second circuit has a function of outputting the fourth potential when each of the potentials of the first to n-th signals is higher than a second reference potential. The second circuit has a function of outputting the third potential when at least one of the potentials of the first to n-th signals is lower than or equal to the second reference potential.

In the above embodiment, the first to 2n-th transistors may be n-channel transistors, and the second potential may be higher than the first potential.

In the above embodiment, the fourth potential may be lower than the third potential.

In the above embodiment, the first to 2n-th transistors may include a metal oxide in a channel formation region.

The above embodiment may have a structure in which a (2n+1)-th transistor and a (2n+2)-th transistor are included, one of a source and a drain of the (2n+1)-th transistor is electrically connected to the first circuit, one of a source and a drain of the (2n+2)-th transistor is electrically connected to the second circuit, and the fourth potential is supplied to the other of the source and the drain of the (2n+1)-th transistor and the other of the source and the drain of the (2n+2)-th transistor.

The above embodiment may have a structure in which a (2n+3)-th transistor and a (2n+4)-th transistor are included, one of a source and a drain of the (2n+3)-th transistor is electrically connected to the first circuit, one of a source and a drain of the (2n+4)-th transistor is electrically connected to the second circuit, and the third potential is supplied to the other of the source and the drain of the (2n+3)-th transistor and the other of the source and the drain of the (2n+4)-th transistor.

One embodiment of the present invention is a driving method of a semiconductor device including a first circuit including first to n-th (n is an integer of 2 or more) transistors, a second circuit including (n+1)-th to 2n-th transistors, a (2n+1)-th transistor, a (2n+2)-th transistor, a (2n+3)-th transistor, and a (2n+4)-th transistor. Either sources or drains of the first to n-th transistors are electrically connected to each other and the others of the sources or the drains of the first to n-th transistors are electrically connected to each other. A source and a drain of each of the (n+1)-th to 2n-th transistors are connected in series to each other. One of a source and a drain of the (2n+1)-th transistor is electrically connected to the first circuit, one of a source and a drain of the (2n+2)-th transistor is electrically connected to the second circuit, one of a source and a drain of the (2n+3)-th transistor is electrically connected to the first circuit, and one of a source and a drain of the (2n+4)-th transistor is electrically connected to the second circuit. First to n-th signals are supplied to the first circuit and the second circuit. An i-th (i is 1 to n) signal is supplied to gates of an i-th transistor and the (n+1)-th transistor. A first potential is supplied to the other of the source and the drain of the (2n+1)-th transistor and the other of the source and the drain of the (2n+2)-th transistor. A second potential is supplied to the other of the source and the drain of the (2n+3)-th transistor. A third potential is supplied to the other of the source and the drain of the (2n+4)-th transistor. In a first period, the (2n+1)-th transistor and the (2n+2)-th transistor are turned on and the (2n+3)-th transistor and the (2n+4)-th transistor are turned off In a second period, the (2n+1)-th transistor and the (2n+2)-th transistor are turned off and the (2n+3)-th transistor and the (2n+4)-th transistor are turned on.

In the above embodiment, the first to 2n-th transistors may be n-channel transistors.

In the above embodiment, the third potential may be lower than the second potential.

In the above embodiment, the second potential and the third potential may be lower than the first potential.

One embodiment of the present invention is a driving method of a semiconductor device including a first circuit including first to n-th (n is an integer of 2 or more) transistors, a second circuit including (n+1)-th to 2n-th transistors, a (2n+1)-th transistor, a (2n+2)-th transistor, a (2n+3)-th transistor, and a (2n+4)-th transistor. The first to 2n-th transistors include back gates. Either sources or drains of the first to n-th transistors are electrically connected to each other and the others of the sources or the drains of the first to n-th transistors are electrically connected to each other. A source and a drain of each of the (n+1)-th to 2n-th transistors are connected in series to each other. One of a source and a drain of the (2n+1)-th transistor is electrically connected to the first circuit, one of a source and a drain of the (2n+2)-th transistor is electrically connected to the second circuit, one of a source and a drain of the (2n+3)-th transistor is electrically connected to the first circuit, and one of a source and a drain of the (2n+4)-th transistor is electrically connected to the second circuit. First to n-th signals are supplied to the first circuit and the second circuit. An i-th (i is 1 to n) signal is supplied to gates of an i-th transistor and the (n+1)-th transistor. A first potential is supplied to the back gates of the first to n-th transistors. A second potential is supplied to the back gates of the (n+1)-th to 2n-th transistors. A third potential is supplied to the other of the source and the drain of the (2n+1)-th transistor and the other of the source and the drain of the (2n+2)-th transistor. A fourth potential is supplied to the other of the source and the drain of the (2n+3)-th transistor and the other of the source and the drain of the (2n+4)-th transistor. In a first period, the (2n+1)-th transistor and the (2n+2)-th transistor are turned on and the (2n+3)-th transistor and the (2n+4)-th transistor are turned off. In a second period, the (2n+1)-th transistor and the (2n+2)-th transistor are turned off and the (2n+3)-th transistor and the (2n+4)-th transistor are turned on.

In the above embodiment, the first to 2n-th transistors may be n-channel transistors, and the second potential may be higher than the first potential.

In the above embodiment, the fourth potential may be lower than the third potential.

Effect of the Invention

According to one embodiment of the present invention, a semiconductor device with a small circuit scale can be provided. A semiconductor device constituted by transistors having the same conductivity type can be provided. A small semiconductor device can be provided. A semiconductor device with low power consumption can be provided. A semiconductor device that can be fabricated by a simple method can be provided. An inexpensive semiconductor device can be provided. A semiconductor device that can output a signal at high accuracy can be provided. A semiconductor device that can be driven at high temperatures can be provided. A highly reliable semiconductor device can be provided. A novel semiconductor device can be provided.

A driving method of a semiconductor device with a small circuit scale can be provided. A driving method of a semiconductor device constituted by transistors having the same conductivity type can be provided. A driving method of a small semiconductor device can be provided. A driving method of a semiconductor device with low power consumption can be provided. A driving method of a semiconductor device that can be fabricated by a simple method can be provided. A driving method of an inexpensive semiconductor device can be provided. A driving method of a semiconductor device that can output a signal at high accuracy can be provided. A driving method of a semiconductor device that can be driven at high temperatures can be provided. A driving method of a highly reliable semiconductor device can be provided. A driving method of a novel semiconductor device can be provided.

Note that the description of these effects does not preclude the existence of other effects. One embodiment of the present invention does not have to have all these effects. Note that other effects will be apparent from the description of the specification, the drawings, the claims, and the like, and other effects can be derived from the description of the specification, the drawings, the claims, and the like.

BRIEF DESCRIPTION OF THE DRAWINGS

FIG. 12A is a circuit diagram showing a structure example of a semiconductor device. FIG. 12B1 and FIG. 12B2 are circuit diagrams each showing an example of a driving method of the semiconductor device.

FIG. 19A is a table showing a classification of crystal structures of IGZO. FIG. 19B is a graph showing an XRD spectrum of a CAAC-IGZO film. FIG. 19C is an image showing a nanobeam electron diffraction pattern of a CAAC-IGZO film.

MODE FOR CARRYING OUT THE INVENTION

Figure 1:
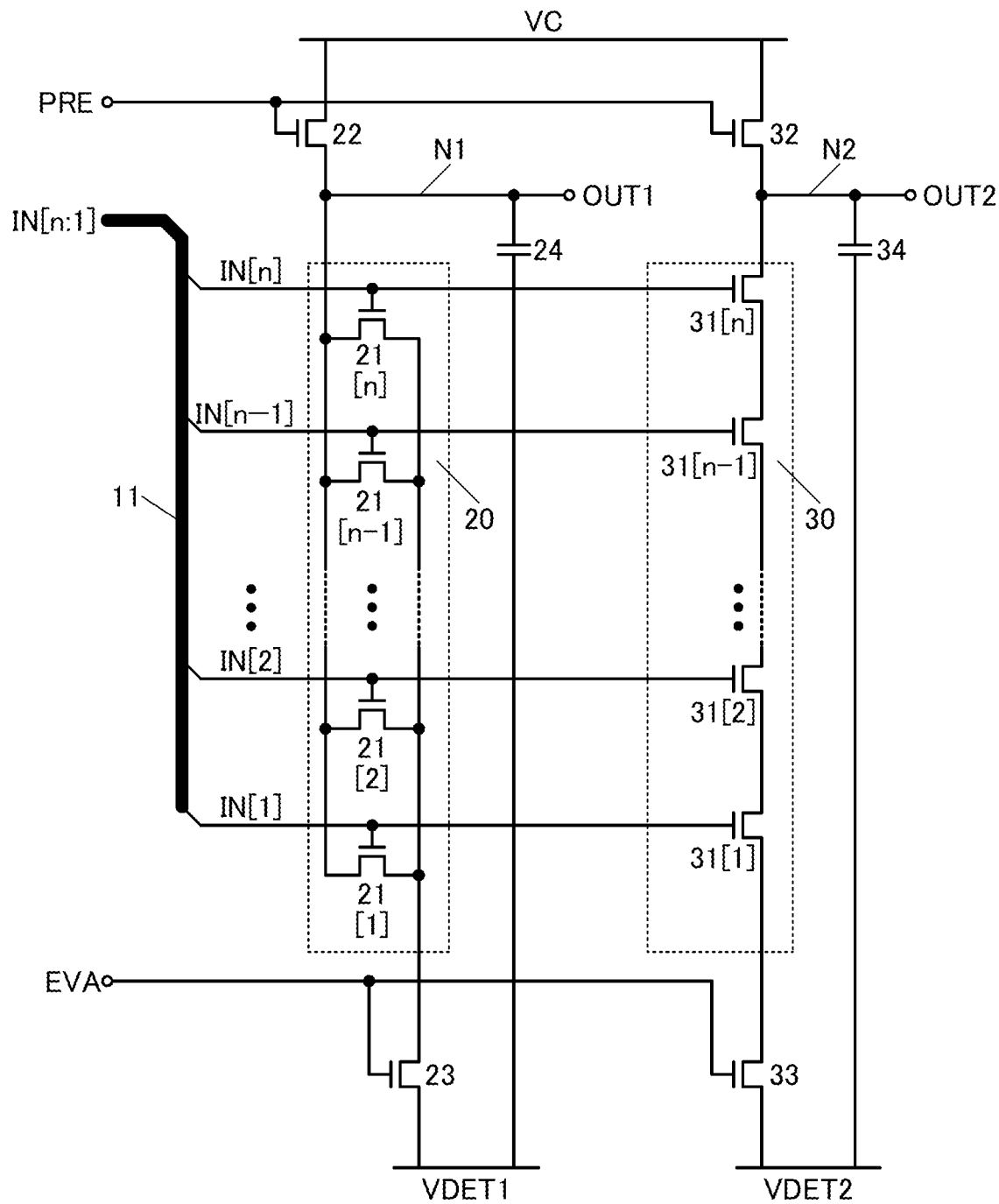
FIG. 1 is a circuit diagram showing a structure example of a semiconductor device.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases.

The position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in the drawings and the like. For example, in an actual manufacturing process, a resist mask or the like might be unintentionally reduced in size by treatment such as etching, which might not be reflected in the drawings for easy understanding.

In a top view (also referred to as a "plan view"), a perspective view, and the like, some components might be omitted for easy understanding of the drawings.

In this specification and the like, the terms "electrode" and "wiring" do not functionally limit these components. For example, an "electrode" is used as part of a "wiring" in some cases, and vice versa. Furthermore, the terms "electrode" and "wiring" also include the case where a plurality of "electrodes" or "wirings" are formed in an integrated manner.

In this specification and the like, the resistance value of a "resistor" is sometimes determined depending on the length of a wiring. Alternatively, the resistance value is sometimes determined through the connection of a conductive layer used for a wiring to a conductive layer with resistivity different from that of the conductive layer. Alternatively, the resistance value is sometimes determined by doping a semiconductor with an impurity.

In this specification and the like, a "terminal" in an electric circuit refers to a portion that inputs or outputs current or voltage and receives or transmits a signal. Accordingly, part of a wiring or an electrode functions as a terminal in some cases.

Note that the term "over" or "under" in this specification and the like does not necessarily mean directly over or directly under regarding the positional relationship between components, nor limit the positional relationship to direct contact. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on driving conditions, for example, when a transistor with a different conductivity type is employed or when the direction of current flow is changed in circuit driving; therefore, it is difficult to define which is the source or the drain. Therefore, the terms source and drain can be switched in this specification and the like.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where different conductive layers are connected to each other through a contact. Note that a wiring may be formed of conductive layers that contain one or more of the same elements or may be formed of conductive layers that contain different elements.

In this specification and the like, the terms "identical", "same", "equal", "uniform", and the like used in describing calculation values and actual measurement values allow for a margin of error of ±20% unless otherwise specified.

Furthermore, in this specification and the like, in the case where etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification and the like can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification and the like can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification might be provided with an ordinal number in the scope of claims in order to avoid confusion among components. Furthermore, a term with an ordinal number in this specification might be provided with a different ordinal number in the scope of claims. Furthermore, even when a term is provided with an ordinal number in this specification, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor of a transistor, the metal oxide is referred to as an oxide semiconductor in some cases. That is, an OS transistor can also be called a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

Embodiment 1

In this embodiment, structure examples of a semiconductor device of one embodiment of the present invention and examples of a driving method thereof will be described with reference to drawings. Note that the present invention is not limited to the structure examples described in this embodiment. Furthermore, any of the structures can be combined as appropriate.

Structure Example_1 of Semiconductor Device

FIG. 1 is a diagram illustrating a structure example of a semiconductor device 10 that is the semiconductor device of one embodiment of the present invention. The semiconductor device 10 includes a circuit 20, a circuit 30, a transistor 22, a transistor 23, a transistor 32, a transistor 33, a capacitor 24, and a capacitor 34. Note that the capacitor 24 and the capacitor 34 are not necessarily provided. The circuit 20 includes a transistor 21[1] to a transistor 21[$n$] ($n$ is an integer of two or more), and the circuit 30 includes a transistor 31[1] to a transistor 31[$n$].

One of a source and a drain of the transistor 23 is electrically connected to one of a source and a drain of each of the transistor 21[1] to the transistor 21[$n$]. That is, either the sources or the drains of the transistor 21[1] to the transistor 21[$n$] are electrically connected to each other. The other of the source and the drain of each of the transistor 21[1] to the transistor 21[$n$] is electrically connected to one of a source and a drain of the transistor 22 and one electrode of the capacitor 24. That is, the others of the sources or the drains of the transistor 21[1] to the transistor 21[$n$] are electrically connected to each other. That is to say, the transistor 21[1] to the transistor 21[$n$] are connected in parallel.

One of a source and a drain of the transistor 33 is electrically connected to one of a source and a drain of the transistor 31[1]. The other of the source and the drain of the transistor 31[1] is electrically connected to one of a source and a drain of a transistor 31[2]. In this manner, the other of a source and a drain of a transistor 31[$k$] ($k$ is an integer greater than or equal to 1 and less than or equal to $n-1$) is electrically connected to one of a source and a drain of a transistor 31[$k+1$]. That is to say, the transistor 31[1] to the transistor 31[$n$] are connected in series. Here, the other of the source and the drain of the transistor 31[$n$] is electrically connected to one of a source and a drain of the transistor 32 and one electrode of the capacitor 34.

A node where the other of the source and the drain of each of the transistor 21[1] to the transistor 21[$n$], the one of the source and the drain of the transistor 22, and the one electrode of the capacitor 24 are electrically connected to each other is referred to as a node N1. A node electrically connected to the other of the source and the drain of the transistor 31[$n$], the one of the source and the drain of the transistor 32, and the one electrode of the capacitor 34 is referred to as a node N2.

Gates of the transistor 21[1] to the transistor 21[$n$] and gates of the transistor 31[1] to the transistor 31[$n$] are electrically connected to a transmission path 11. A signal IN[1] to a signal IN[n] are input to the transmission path 11. The signal IN[1] to the signal IN[n] input to the transmission path 11 are supplied to the transistor 21[1] to the transistor 21[$n$] and the transistor 31[1] to the transistor 31[$n$]. Specifically, a signal IN[i] (i is an integer greater than or equal to 1 and less than or equal to n) is supplied to a gate of a transistor 21[$i$] and a gate of a transistor 31[$i$].

A signal OUT1 can be output from the node N1. A signal OUT2 can be output from the node N2.

A signal PRE can be supplied to a gate of the transistor 22 and a gate of the transistor 32. The signal PRE has a function of controlling on and off of the transistor 22 and the transistor 32. The transistor 22 and the transistor 32 have functions as switches that are turned on or off by the signal PRE.

A signal EVA can be supplied to gates of the transistor 23 and the transistor 33. The signal EVA has a function of controlling on and off of the transistor 23 and the transistor 33. The transistor 23 and the transistor 33 have functions as switches that are turned on or off by the signal EVA.

The capacitor 24 has a function of retaining the potential of the node N1. The capacitor 34 has a function of retaining the potential of the node N2.

The capacitor 24 can inhibit the potential of the signal OUT1 from varying due to the parasitic capacitance and the like between the gate of the transistor 22 and the one of the source and the drain of the transistor 22 when the transistor 22 is changed from an on state to an off state. Specifically, the potential of the signal OUT1 can be inhibited from varying in response to a change in the potential of the gate of the transistor 22 due to the parasitic capacitance and the like when the transistor 22 is changed from the on state to the off state. In addition, the capacitor 34 can inhibit the potential of the signal OUT2 from varying due to the parasitic capacitance and the like between the gate of the transistor 32 and the one of the source and the drain of the transistor 32 when the transistor 32 is changed from the on state to the off state. Specifically, the potential of the signal OUT2 can be inhibited from varying in response to a change in the potential of the gate of the transistor 32 due to the parasitic capacitance and the like when the transistor 32 is changed from the on state to the off state.

A potential VC is supplied to the other of the source and the drain of the transistor 22 and the other of the source and the drain of the transistor 32. A potential VDET1 is supplied to the other of the source and the drain of the transistor 23 and the other electrode of the capacitor 24. A potential VDET2 is supplied to the other of the source and the drain of the transistor 33 and the other electrode of the capacitor 34.

As described in detail later, all of the transistor 21[1] to the transistor 21[n], the transistor 22, the transistor 23, the transistor 31[1] to the transistor 31[n], the transistor 32, and the transistor 33 can have the same conductivity type. For example, the transistor 21[1] to the transistor 21[n], the transistor 22, the transistor 23, the transistor 31[1] to the transistor 31[n], the transistor 32, and the transistor 33 can be n-channel transistors.

Transistors with an extremely low off-state current are preferably used as the transistor 21[1] to the transistor 21[n], the transistor 22, the transistor 31[1] to the transistor 31[n], and the transistor 32. Thus, the potential of the node N1 can be retained for an extremely long time. The potential of the node N2 can also be retained for an extremely long time. This allows the circuit 20 to keep outputting the signal OUT1 at high accuracy and the circuit 30 to keep outputting the signal OUT2 at high accuracy, as described in detail later.

An OS transistor is given as an example of a transistor with an extremely low off-state current. Specifically, the off-state current per micrometer of channel width at room temperature can be lower than $1 \times 10^{-20}$ A, preferably lower than $1 \times 10^{-22}$ A, further preferably lower than $1 \times 10^{-24}$ A.

In addition, the OS transistor has superior electrical characteristics in a high-temperature environment to a transistor including silicon in a channel formation region (hereinafter, also referred to as a Si transistor). When OS transistors are used as the transistors included in the semiconductor device 10, the semiconductor device 10 achieves stable operation and high reliability even in a high-temperature environment. In particular, when OS transistors are used as all of the transistor 21[1] to the transistor 21[n], the transistor 22, the transistor 23, the transistor 31[1] to the transistor 31[n], the transistor 32, and the transistor 33, the semiconductor device 10 achieves stable operation and high reliability even in a high-temperature environment.

Note that Si transistors may be used as the transistor 21[1] to the transistor 21[n], the transistor 22, the transistor 23, the transistor 31[1] to the transistor 31[n], the transistor 32, and the transistor 33. Examples of the Si transistor include a transistor containing amorphous silicon, a transistor containing crystalline silicon (typically, low-temperature polysilicon), and a transistor containing single crystal silicon. For example, when a transistor containing single crystal silicon is used as the transistor 21[1] to the transistor 21[n], the transistor 22, the transistor 23, the transistor 31[1] to the transistor 31[n], the transistor 32, and the transistor 33, these transistors can have high on-state current. Thus, the semiconductor device 10 can be driven at high speed.

As described in detail later, the semiconductor device 10 can sense whether an event has occurred in a circuit generating the signal IN[1] to the signal IN[n]. Assuming that, for example, a first reference potential is higher than a second reference potential, the semiconductor device 10 can sense that at least one of the potentials of the signal IN[1] to the signal IN[n] is higher than the first reference potential and lower than or equal to the second reference potential. Alternatively, the semiconductor device 10 can sense that each of the potentials of the signal IN[1] to the signal IN[n] is higher than the second reference potential and lower than or equal to the first reference potential. For example, in the case where at least one of the potentials of the signal IN[1] to the signal IN[n] is higher than the first reference potential and lower than or equal to the second reference potential, it can be determined that an event has occurred in the circuit generating the signal IN[1] to the signal IN[n]. Here, sensing results by the semiconductor device 10 can be output as the signal OUT1 and the signal OUT2.

<Example of Driving Method of Semiconductor Device>

Figure 2:
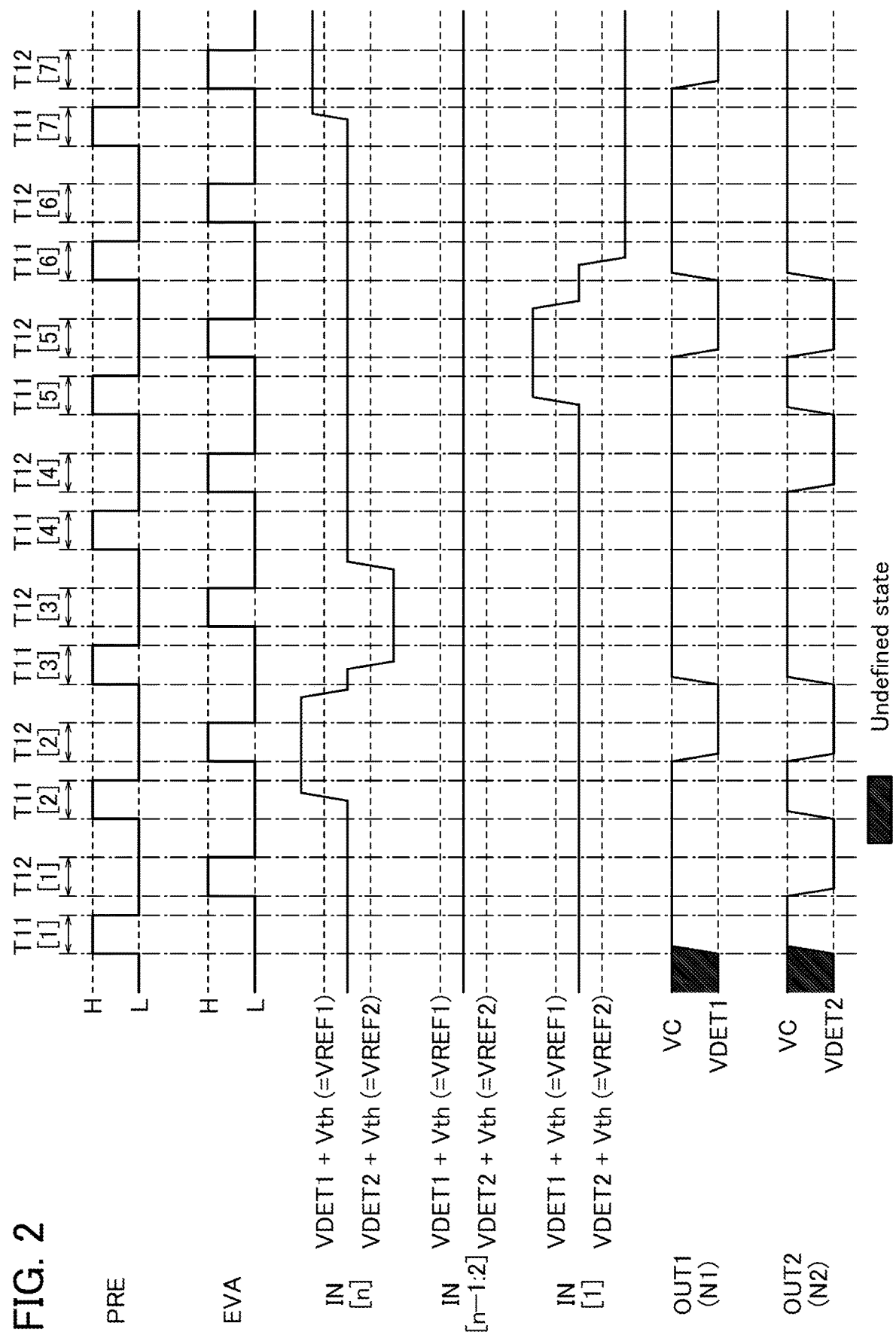
FIG. 2 is a timing chart showing an example of a driving method of a semiconductor device.

Next, an example of a driving method of the semiconductor device 10 will be described. FIG. 2 is a timing chart showing an example of the driving method of the semiconductor device 10 having the structure illustrated in FIG. 1. In FIG. 2, "H" denotes a high potential and "L" denotes a low potential. The same applies to other timing charts. In FIG. 2, changes in potential due to a wiring resistance, the resistance between a drain and a source of a transistor, or the like are not taken into consideration. The same applies to other timing charts and the like.

An example of the driving method of the semiconductor device 10 shown in FIG. 2 is divided into a period T11[1] to a period T11[7] and a period T12[1] to a period T12[7]. An example of the driving method of the semiconductor device 10 in the period T12[1] to the period T12[7] is also shown in FIG. 3 to FIG. 9.

In the following description, the threshold voltages of the transistor 21[1] to the transistor 21[n] and the transistor 31[1] to the transistor 31[n] are all assumed to be equal to each other, "Vth".

An example of the driving method of the semiconductor device 10 is described below on the assumption that the transistor 21[1] to the transistor 21[n], the transistor 22, the transistor 23, the transistor 31[1] to the transistor 31[n], the transistor 32, and the transistor 33 are all n-channel transistors. Even when some or all of the transistor 21[1] to the transistor 21[n], the transistor 22, the transistor 23, the transistor 31[1] to the transistor 31[n], the transistor 32, and the transistor 33 are p-channel transistors, the following description can be referred to by, for example, changing the magnitude relation of potentials.

The potential VC is higher than the potential VDET1 and the potential VDET2. The potential VDET1 is higher than the potential VDET2. That is, "VC>VDET1>VDET2" is satisfied.

In the period T11[1], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In the period T12[1], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[1], the potential of each of the signal IN[1] to the signal IN[n] is higher than the potential "VDET2+Vth" and lower than or equal to the potential "VDET1+Vth". Here, in the case where the difference between a gate potential and a source potential of a transistor is larger than the threshold voltage of the transistor, current flows between the drain and the source of the transistor. In contrast, in the case where the difference between the gate potential and the source potential of the transistor is smaller than or equal to the threshold voltage of the transistor, no current flows between the drain and the source of the transistor.

When the transistor 23 is turned on, either the sources or the drains of the transistor 21[1] to the transistor 21[n] have the potential VDET1. Here, the other of the source and the drain of each of the transistor 21[1] to the transistor 21[n] has the potential VC. When the transistor 33 is turned on, one of the source and the drain of the transistor 31[1] has the potential VDET2. Here, the other of the source and the drain of the transistor 31[n] has the potential VC.

As described above, the transistor 21[1] to the transistor 21[n] and the transistor 31[1] to the transistor 31[n] are n-channel transistors and the potential VC is higher than the potential VDET1 and the potential VDET2. In addition, the transistor 31[1] to the transistor 31[n] are connected in series. Hence, either the sources or the drains of the transistor 21[1] to the transistor 21[n] and the transistor 31[1] to the transistor 31[n] are sources and the others of the sources or the drains of the transistor 21[1] to the transistor 21[n] and the transistor 31[1] to the transistor 31[n] are drains.

Thus, in the period T12[1], the difference between the gate potential and the source potential of each of the transistor 21[1] to the transistor 21[n] is smaller than or equal to the threshold voltage Vth. Hence, no current flows between the drain and the source of each of the transistor 21[1] to the transistor 21[n]. As a result, the potential of the node N1 remains at the potential VC and the potential of the signal OUT1 becomes the potential VC.

In contrast, the difference between the gate potential and the source potential of each of the transistor 31[1] to the transistor 31[n] is larger than the threshold voltage Vth. Hence, current flows between the drain and the source of the transistor 33 from the node N2 through the transistor 31[1] to the transistor 31[n]. As a result, the potential of the node N2 changes into the potential VDET2 and the potential of the signal OUT2 becomes the potential VDET2.

Figure 3:
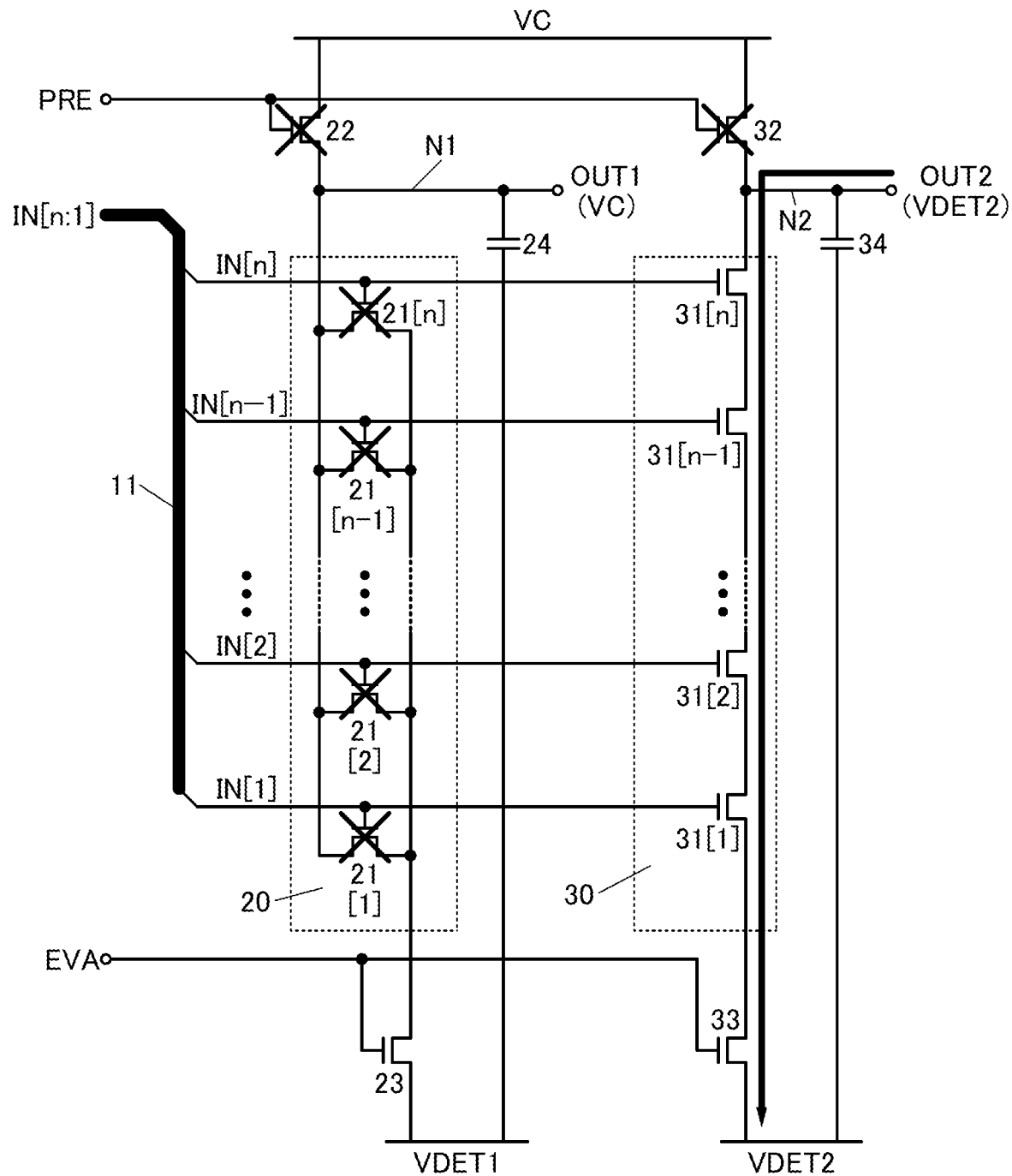
FIG. 3 is a circuit diagram showing an example of a driving method of a semiconductor device.

FIG. 3 is a circuit diagram illustrating a state of the semiconductor device 10 in the period T12[1]. In FIG. 3, crosses are put on transistors where no current can flow between drains and sources. Specifically, the crosses are put on the transistors where the difference between the gate potential and the source potential is smaller than or equal to the threshold voltage. In contrast, no crosses are put on transistors where current can flow between drains and sources. Specifically, no crosses are put on the transistors where the difference between the gate potential and the source potential is higher than the threshold voltage. Current is denoted by an arrow. The same applies to other drawings in some cases.

In a period T11[2], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In the period T12[2], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[2], the potential of the signal IN[n] is higher than the potential "VDET1+Vth", and the potential of each of the signal IN[1] to the signal IN[n−1] is higher than the potential "VDET2+Vth" and lower than or equal to the potential "VDET1+Vth". Since the potential of the signal IN[n] is higher than the potential "VDET1+Vth", the difference between the gate potential and the source potential of the transistor 21[n] is larger than the threshold voltage Vth. As described above, the transistor 21[1] to the transistor 21[n] are connected in parallel. Hence, current flows between the drain and the source of the transistor 23 from the node N1 through the transistor 21[n]. As a result, the potential of the node N1 changes into the potential VDET1 and the potential of the signal OUT1 becomes the potential VDET1.

As in the period T12[1], the difference between the gate potential and the source potential of each of the transistor 31[1] to the transistor 31[n] is larger than the threshold voltage Vth. Hence, current flows between the drain and the source of the transistor 33 from the node N2 through the transistor 31[1] to the transistor 31[n]. As a result, as in the period T12[1], the potential of the node N2 changes into the potential VDET2 and the potential of the signal OUT2 becomes the potential VDET2.

Figure 4:
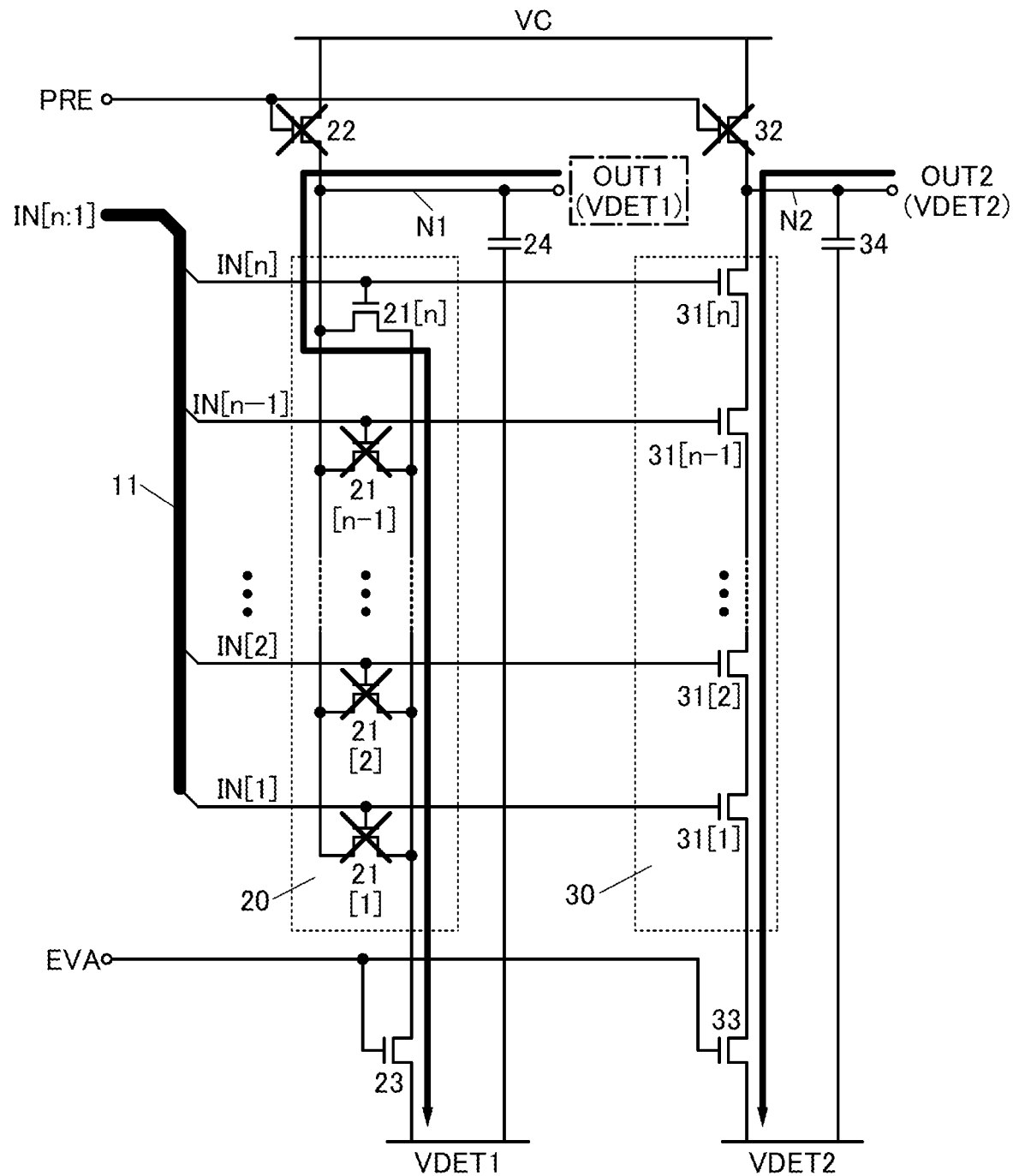
FIG. 4 is a circuit diagram showing an example of a driving method of a semiconductor device.

FIG. 4 is a circuit diagram illustrating a state of the semiconductor device 10 in the period T12[2]. In FIG. 4, the signal OUT1 is surrounded by a dashed-dotted line in order to show that the potential of the signal OUT1 in the period T12[2] is different from that of the signal OUT1 in the period T12[1].

In a period T11[3], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In a period T12[3], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[3], the potential of the signal IN[n] is lower than or equal to the potential "VDET2+Vth", and the potential of each of the signal IN[1] to the signal IN[n−1] is higher than the potential "VDET2+Vth" and lower than or equal to the potential "VDET1+Vth". Since the potential of the signal IN[n] is lower than or equal to the potential "VDET2+Vth", the difference between the gate potential and the source potential of the transistor 31[n] is smaller than or equal to the threshold voltage Vth. As described above, the transistor 31[1] to the transistor 31[n] are connected in series. Hence, no current flows from the node N2 to the transistor 33, the potential of the node N2 remains at the potential VC, and the potential of the signal OUT2 becomes the potential VC.

As in the period T12[1], the difference between the gate potential and the source potential of each of the transistor 21[1] to the transistor 21[n] is smaller than or equal to the threshold voltage Vth. Hence, no current flows between the drain and the source of each of the transistor 21[1] to the transistor 21[n]. As a result, as in the period T12[1], the potential of the node N1 remains at the potential VC and the potential of the signal OUT1 becomes the potential VC.

Figure 5:
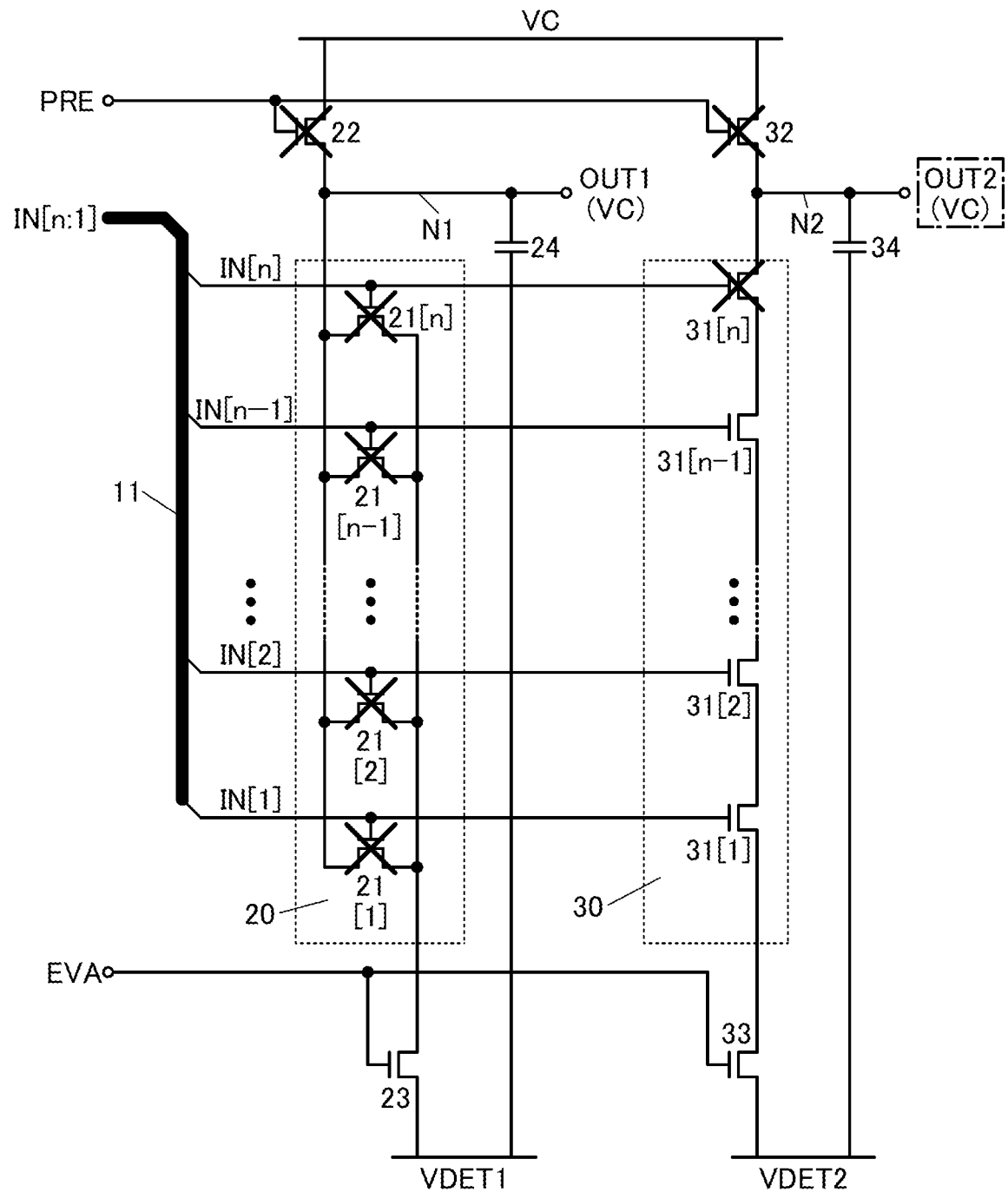
FIG. 5 is a circuit diagram showing an example of a driving method of a semiconductor device.

FIG. 5 is a circuit diagram illustrating a state of the semiconductor device 10 in the period T12[3]. In FIG. 5, the signal OUT2 is surrounded by a dashed-dotted line in order to show that the potential of the signal OUT2 in the period T12[3] is different from that of the signal OUT2 in the period T12[1].

In a period T11[4], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In a period T12[4], the signal PRE is set at a low potential. Thus, the transistor 22 and the transistor 32 are turned off.

Furthermore, the signal EVA is set at a high potential. Thus, the transistor 23 and the transistor 33 are turned on.

It is assumed that in the period T12[4], the potential of each of the signal IN[1] to the signal IN[n] is higher than the potential "VDET2+Vth" and lower than or equal to the potential "VDET1+Vth" as in the period T12[1]. In that case, as in the period T12[1], the potential of the signal OUT1 becomes the potential VC and the potential of the signal OUT2 becomes the potential VDET2.

Figure 6:
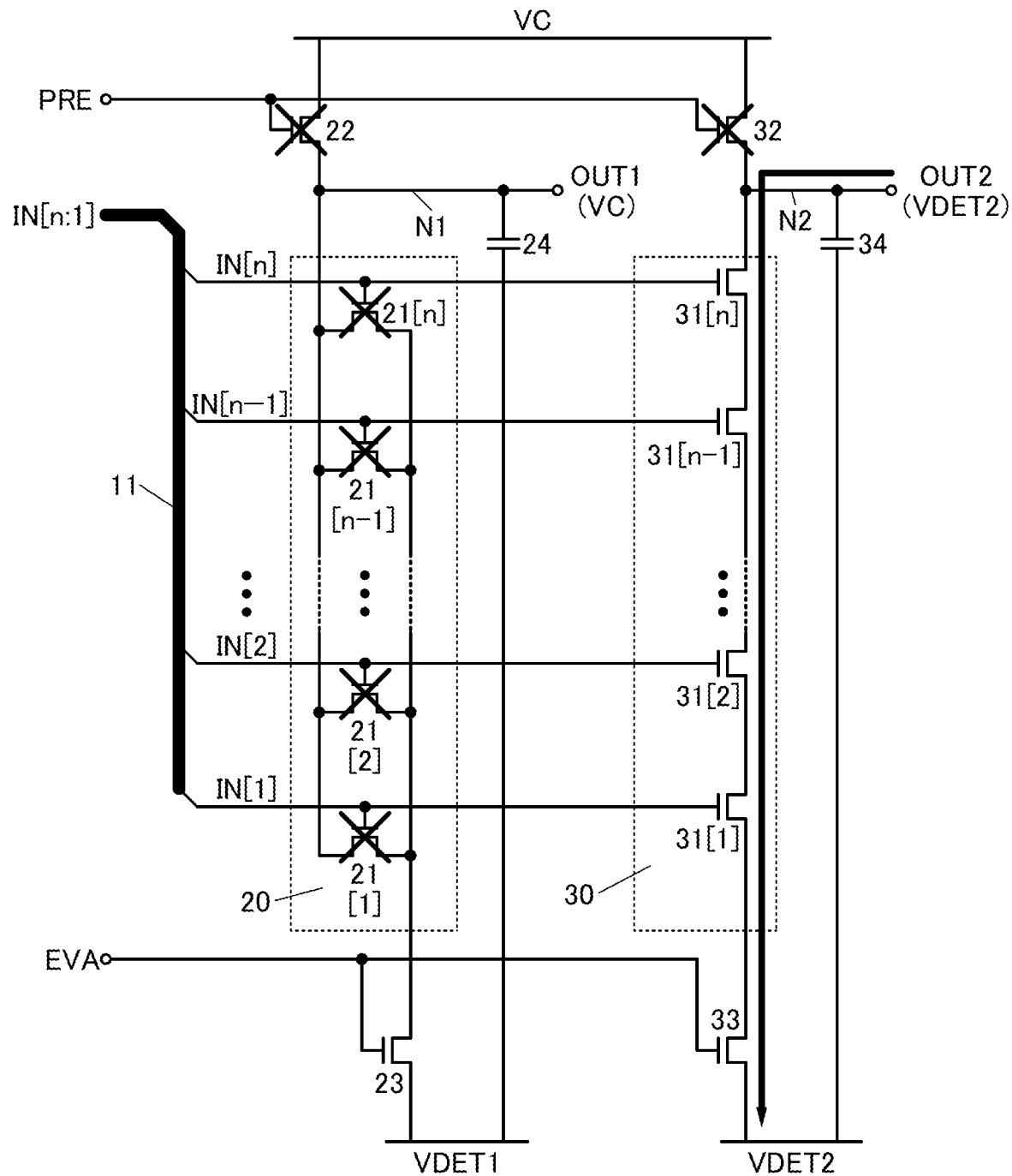
FIG. 6 is a circuit diagram showing an example of a driving method of a semiconductor device.

FIG. 6 is a circuit diagram illustrating a state of the semiconductor device 10 in the period T12[4]. FIG. 6 illustrates a state similar to that in FIG. 3.

In a period T11[5], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In a period T12[5], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[5], the potential of the signal IN[1] is higher than the potential "VDET1+Vth", and the potential of each of the signal IN[2] to the signal IN[n] is higher than the potential "VDET2+Vth" and lower than or equal to the potential "VDET1+Vth". Since the potential of the signal IN[1] is higher than the potential "VDET1+Vth", the difference between the gate potential and the source potential of the transistor 21[1] is larger than the threshold voltage Vth. As described above, the transistor 21[1] to the transistor 21[n] are connected in parallel. Hence, current flows between the drain and the source of the transistor 23 from the node N1 through the transistor 21[1]. As a result, the potential of the node N1 changes into the potential VDET1 and the potential of the signal OUT1 becomes the potential VDET1.

As in the period T12[4], the difference between the gate potential and the source potential of each of the transistor 31[1] to the transistor 31[n] is larger than the threshold voltage Vth. Hence, current flows between the drain and the source of the transistor 33 from the node N2 through the transistor 31[1] to the transistor 31[n]. As a result, as in the period T12[4], the potential of the node N2 changes into the potential VDET2 and the potential of the signal OUT2 becomes the potential VDET2.

Figure 7:
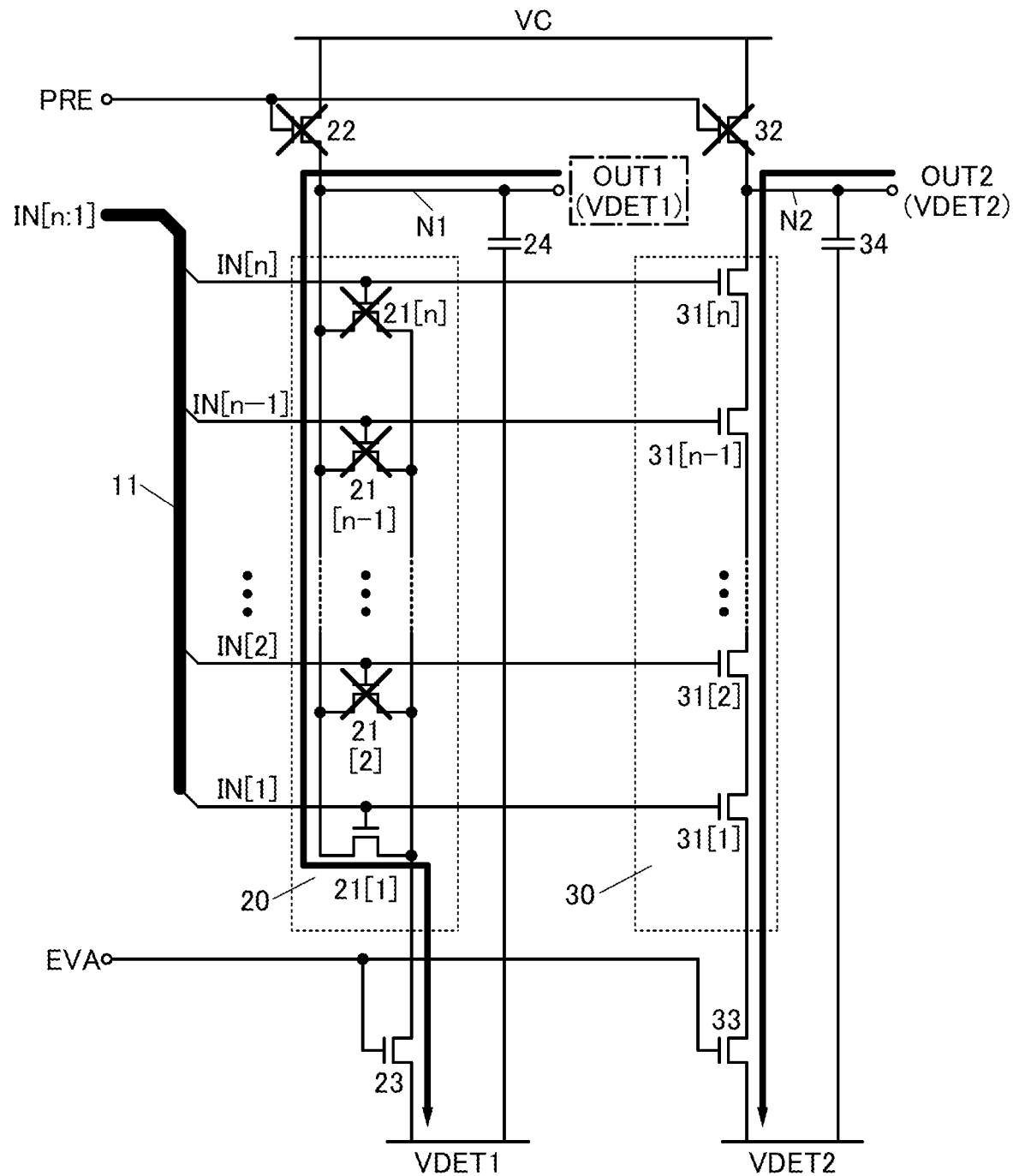
FIG. 7 is a circuit diagram showing an example of a driving method of a semiconductor device.

FIG. 7 is a circuit diagram illustrating a state of the semiconductor device 10 in the period T12[5]. In FIG. 7, the signal OUT1 is surrounded by a dashed-dotted line in order to show that the potential of the signal OUT1 in the period T12[5] is different from that of the signal OUT1 in the period T12[4].

In a period T11[6], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In a period T12[6], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[6], the potential of the signal IN[1] is lower than or equal to the potential "VDET2+Vth", and the potential of each of the signal IN[2] to the signal IN[n] is higher than the potential "VDET2+Vth" and lower than or equal to the potential "VDET1+Vth". Since the potential of the signal IN[1] is lower than or equal to the potential "VDET2+Vth", the difference between the gate potential and the source potential of the transistor 31[1] is smaller than or equal to the threshold voltage Vth. As described above, the transistor 31[1] to the transistor 31[n] are connected in series. Hence, no current flows from the node N2 to the transistor 33, the potential of the node N2 remains at the potential VC, and the potential of the signal OUT2 becomes the potential VC.

As in the period T12[4], the difference between the gate potential and the source potential of each of the transistor 21[1] to the transistor 21[n] is smaller than or equal to the threshold voltage Vth. Hence, no current flows between the drain and the source of each of the transistor 21[1] to the transistor 21[n]. As a result, as in the period T12[4], the potential of the node N1 remains at the potential VC and the potential of the signal OUT1 becomes the potential VC.

Figure 8:
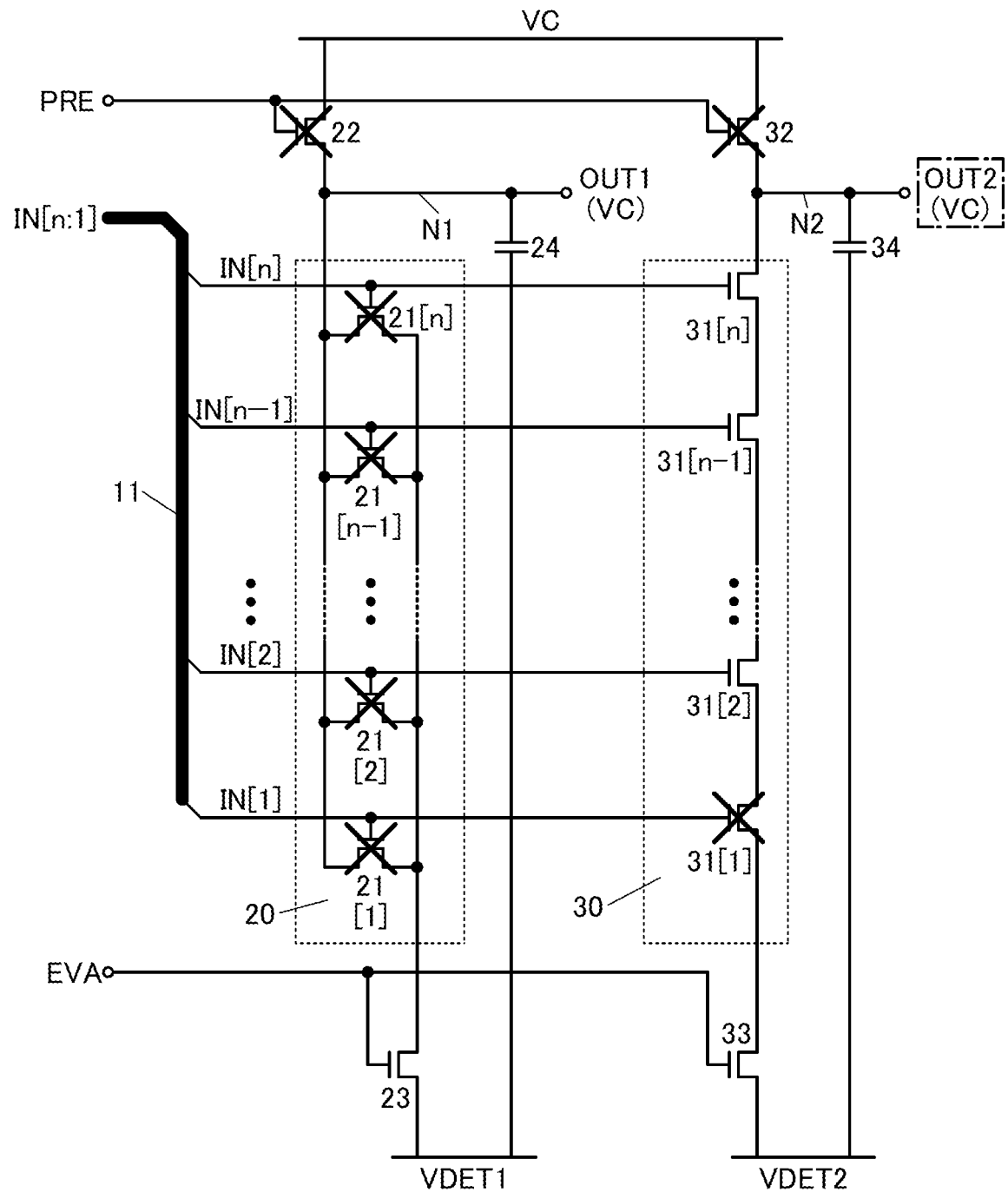
FIG. 8 is a circuit diagram showing an example of a driving method of a semiconductor device.

FIG. 8 is a circuit diagram illustrating a state of the semiconductor device 10 in the period T12[6]. In FIG. 8, the signal OUT2 is surrounded by a dashed-dotted line in order to show that the potential of the signal OUT2 in the period T12[6] is different from that of the signal OUT2 in the period T12[4].

In the period T11[7], the signal PRE is set at a high potential. Thus, the transistor 22 and the transistor 32 are turned on. When the transistor 22 is turned on, the potential of the node N1 becomes the potential VC. When the transistor 32 is turned on, the potential of the node N2 becomes the potential VC.

In the period T12[7], the signal PRE is set at a low potential. Thus, the transistor 22 and the transistor 32 are turned off. Furthermore, the signal EVA is set at a high potential. Thus, the transistor 23 and the transistor 33 are turned on.

It is assumed that in the period T12[7], the potential of the signal IN[n] is higher than the potential "VDET1+Vth", the potential of the signal IN[1] is lower than or equal to the potential "VDET2+Vth", and the potential of each of the signal IN[2] to the signal IN[n−1] is higher than the potential "VDET2+Vth" and lower than or equal to the potential "VDET1+Vth". Since the potential of the signal IN[n] is higher than the potential "VDET1+Vth", the difference between the gate potential and the source potential of the transistor 21[n] is larger than the threshold voltage Vth. As described above, the transistor 21[1] to the transistor 21[n] are connected in parallel. Hence, current flows between the drain and the source of the transistor 23 from the node N1 through the transistor 21[n]. As a result, the potential of the node N1 changes into the potential VDET1 and the potential of the signal OUT1 becomes the potential VDET1.

Since the potential of the signal IN[1] is lower than or equal to the potential "VDET2+Vth", the difference between the gate potential and the source potential of the transistor 31[1] is smaller than or equal to the threshold voltage Vth. As described above, the transistor 31[1] to the transistor 31[n] are connected in series. Hence, no current flows from the node N2 to the transistor 33, the potential of the node N2 remains at the potential VC, and the potential of the signal OUT2 becomes the potential VC.

Figure 9:
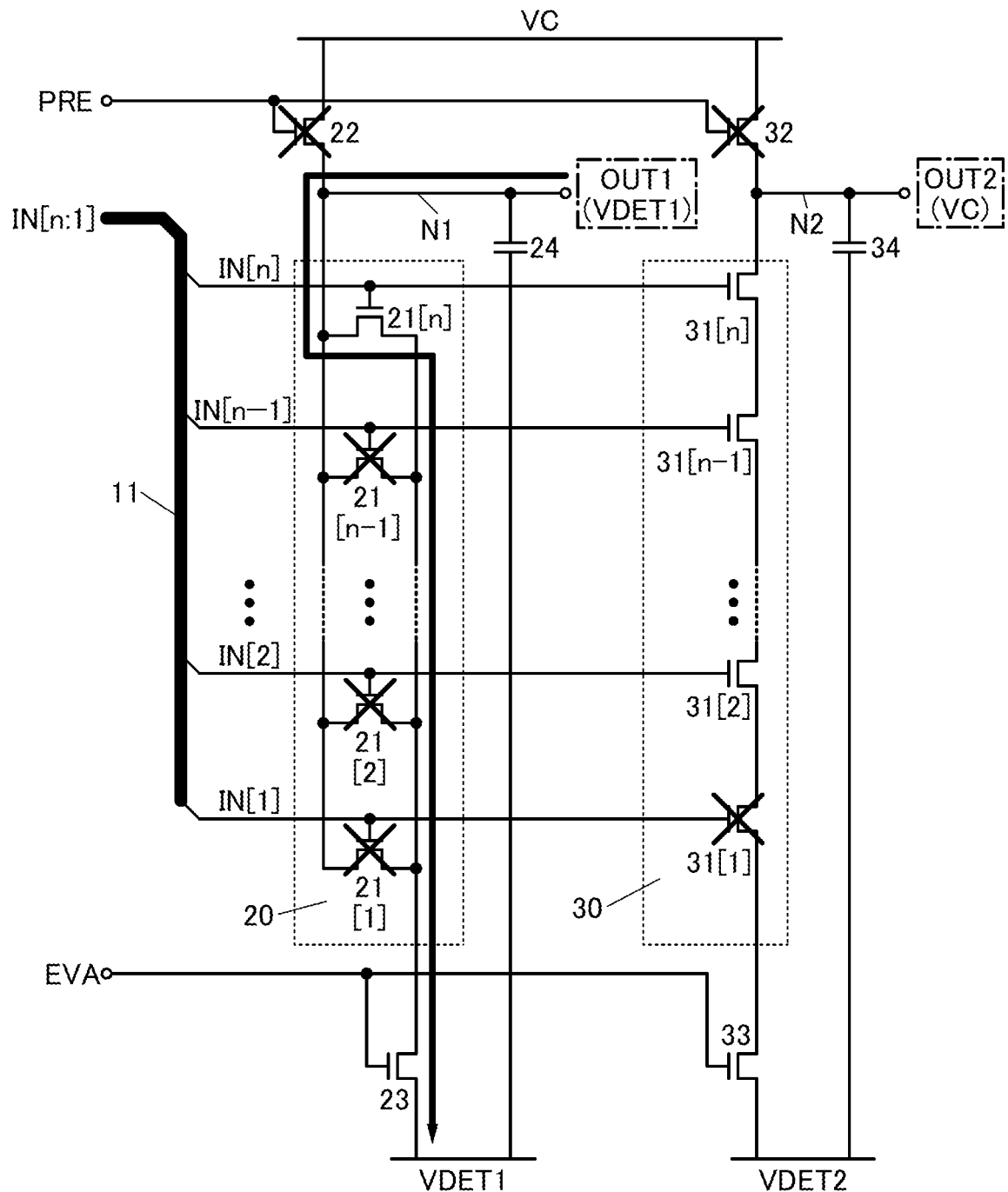
FIG. 9 is a circuit diagram showing an example of a driving method of a semiconductor device.

FIG. 9 is a circuit diagram illustrating a state of the semiconductor device 10 in the period T12[7]. In FIG. 9, the signal OUT1 is surrounded by a dashed-dotted line in order to show that the potential of the signal OUT1 in the period T12[7] is different from that of the signal OUT1 in the period T12[1] and the period T12[4]. In addition, the signal OUT2 is surrounded by a dashed-dotted line in order to show that the potential of the signal OUT2 in the period T12[7] is different from that of the signal OUT2 in the period T12[1] and the period T12[4].

From the above, the circuit 20 can be said to have a function of sensing that at least one of the potentials of the signal IN[1] to the signal IN[n] is higher than the potential "VDEF1+Vth" or each of the potentials of the signal IN[1] to the signal IN[n] is lower than or equal to the potential "VDEF1+Vth", and outputting the sensing result as the signal OUT1. Thus, when the potential "VDEF1+Vth" is a reference potential VREF1, the circuit 20 can be said to have a function of sensing that at least one of the potentials of the signal IN[1] to the signal IN[n] is higher than the reference potential VREF1 or each of the potentials of the signal IN[1] to the signal IN[n] is lower than or equal to the reference potential VREF1. Here, since the potential VDET1 can be denoted by the potential "VREF1−Vth", the potential VDET1 can be said to be a potential corresponding to the reference potential VREF1.

The circuit 30 can be said to have a function of sensing that at least one of the potentials of the signal IN[1] to the signal IN[n] is lower than or equal to the potential "VDEF2+Vth" or each of the potentials of the signal IN[1] to the signal IN[n] is higher than the potential "VDEF2+Vth", and outputting the sensing result as the signal OUT2. Thus, when the potential "VDEF2+Vth" is a reference potential VREF2, the circuit 30 can be said to have a function of sensing that at least one of the potentials of the signal IN[1] to the signal IN[n] is lower than or equal to the reference potential VREF2 or each of the potentials of the signal IN[1] to the signal IN[n] is higher than the reference potential VREF2. Here, the potential VDET2 can be denoted by the potential "VREF2−Vth", the potential VDET2 can be said to be a potential corresponding to the reference potential VREF2.

As described above, the potential VDET1 is higher than the potential VDET2. In addition, the threshold voltages of the transistor 21[1] to the transistor 21[n] and the transistor 31[1] to the transistor 31[n] are all assumed to be equal to each other, "Vth". Thus, the reference potential VREF1 is higher than reference potential VREF2.

From the above, the semiconductor device 10 can sense that at least one of the potentials of the signal IN[1] to the signal IN[n] is higher than the reference potential VREF1 and lower than or equal to the reference potential VREF2. Alternatively, the semiconductor device 10 can sense that each of the potentials of the signal IN[1] to the signal IN[n] is higher than the reference potential VREF2 and lower than or equal to the reference potential VREF1. Accordingly, it can be determined that, for example, an event has occurred in the circuit generating the signal IN[1] to the signal IN[n]. For example, in the case where at least one of the potentials of the signal IN[1] to the signal IN[n] is higher than the reference potential VREF1 and lower than or equal to the reference potential VREF2, it can be determined that an event has occurred in the circuit generating the signal IN[1] to the signal IN[n].

The above sensing results can be output as the signal OUT1 and the signal OUT2. Specifically, in a period T11, the transistor 22 and the transistor 32 are turned on and the transistor 23 and the transistor 33 are turned off, so that the potential of the node N1 and the potential of the node N2 each become the potential VC. Next, in a period T12, the transistor 22 and the transistor 32 are turned off and the transistor 23 and the transistor 33 are turned on, so that the semiconductor device 10 can output signals with potentials corresponding to the potentials of the signal IN[1] to the signal IN[n] as the signal OUT1 and the signal OUT2. For example, it can be determined that no event has occurred in the circuit generating the signal IN[1] to the signal IN[n] in the case where the potential of the signal OUT1 is the potential VC and the potential of the signal OUT2 is the potential VDET2, and it can be determined that an event has occurred in the case where the potentials of the signal OUT1 and the signal OUT2 are other potentials. Note that the potentials of the node N1 and the node N2 each become the potential VC in the period T11 and then the signal OUT1 and the signal OUT2 are output in the period T12; thus, it can be said that precharge is performed in the period T11. The potential VC can be said to be a precharge potential.

From the above, the semiconductor device 10 can be said to have a function of sensing the potential level of the signal IN[1] to the signal IN[n]. Here, a comparator is not provided in the semiconductor device 10 as illustrated in FIG. 1. When the function of sensing the potential level of the signal IN[1] to the signal IN[n] is to be achieved by comparators, a large number of comparators are needed particularly when n is large, as described above. Meanwhile, in the semiconductor device 10, the number of transistors 21 and the number of transistors 31 are only necessary to be increased to correspond to larger n. For example, n can be increased by 1 only by adding one transistor 21 and one transistor 31. As a result, a significant increase in the circuit scale of the semiconductor device can be inhibited even when n is larger. Thus, the circuit scale of the semiconductor device can be reduced according to one embodiment of the present invention. This results in a reduction in the size and power consumption of the semiconductor device.

As described above, the characteristics of the comparator significantly degrade when the comparator is constituted by transistors having the same conductivity type. In contrast, even when all the transistors included in the semiconductor device 10 have the same conductivity type, the characteristics of the semiconductor device 10 do not significantly change as compared with the case where the semiconductor device 10 is constituted by a CMOS. Hence, all the transistors included in the semiconductor device 10 can be transistors having the same conductivity type. For example, all of the transistor 21[1] to the transistor 21[n], the transistor 22, the transistor 23, the transistor 31[1] to the transistor 31[n], the transistor 32, and the transistor 33 can be n-channel transistors. When all the transistors included in the semiconductor device 10 have the same conductivity type, n-channel transistors and p-channel transistors need not be separately formed. As a result, the semiconductor device 10 can be fabricated by a simple method. This can reduce the fabrication costs of the semiconductor device 10 and make the semiconductor device 10 inexpensive.

Since all the transistors included in the semiconductor device 10 can be n-channel transistors, all the transistors included in the semiconductor device 10 can be OS transistors. As described above, an OS transistor has a feature of an extremely low off-state current. Thus, when OS transistors are used as all the transistors included in the semiconductor device 10, for example, the potential of the node N1 can be retained at the potential VC for a long time in the case where the potential of the node N1 does not become the potential VDET1 in the period T12. Also in the case where the potential of the node N2 does not become the potential VDET2 in the period T12, the potential of the node N2 can be retained at the potential VC for a long time. Thus, even when the period T12 becomes long, the circuit 20 can keep outputting the signal OUT1 at high accuracy and the circuit 30 can keep outputting the signal OUT2 at high accuracy.

Structure Example_2 of Semiconductor Device

Figure 10:
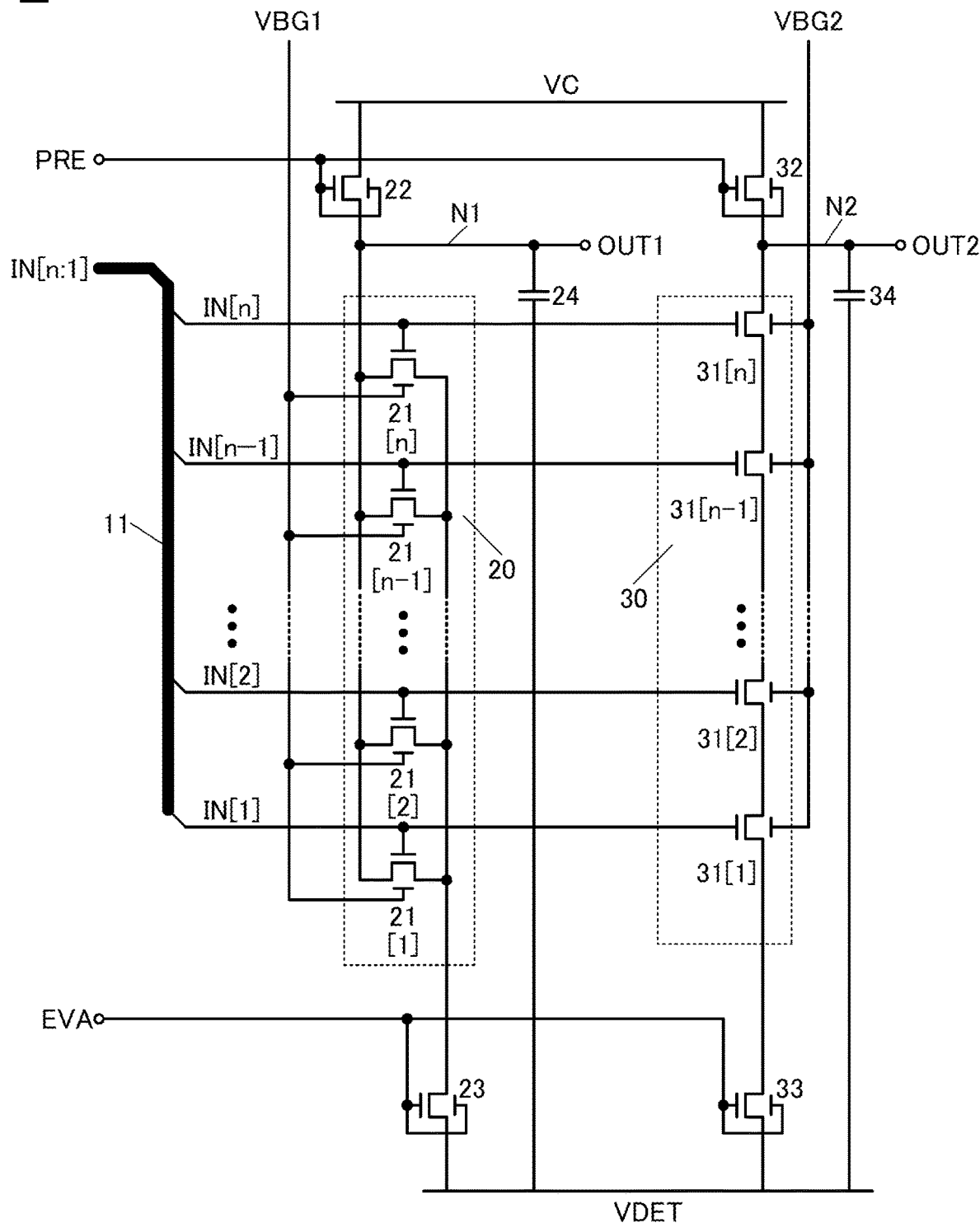
FIG. 10 is a circuit diagram showing a structure example of a semiconductor device.

FIG. 10 is a diagram illustrating a structure example of the semiconductor device 10, which is a modification example of the structure illustrated in FIG. 1. The semiconductor device 10 illustrated in FIG. 10 is different from the semiconductor device 10 illustrated in FIG. 1 in that the transistor 21[1] to the transistor 21[n], the transistor 22, the transistor 23, the transistor 31[1] to the transistor 31[n], the transistor 32, and the transistor 33 each include a back gate as well as a gate.

In this specification and the like, the term "gate" refers to a front gate in some cases. Note that the term "gate" can be replaced with the term "back gate" in some cases. In the case where a transistor includes a gate and a back gate, one of the gate and the back gate is referred to as a first gate and the other thereof is referred to as a second gate, in some cases.

A potential VBG1 can be supplied to the back gate of each of the transistor 21[1] to the transistor 21[n]. A potential VBG2 can be supplied to the back gate of each of the transistor 31[1] to the transistor 31[n].

When the back gate potential of a transistor is controlled, the threshold voltage of the transistor can be controlled. Specifically, the threshold voltage of an n-channel transistor can be reduced as the back gate potential thereof increases. Thus, the reference potential VREF1 can differ from the reference potential VREF2 even when the potential of the other of the source and the drain of the transistor 23 is equal to that of the other of the source and the drain of the transistor 33. Specifically, the reference potential VREF1 can be higher than the reference potential VREF2 when the potential VBG1 is lower than the potential VBG2.

In FIG. 10, the other of the source and the drain of the transistor 23 and the other of the source and the drain of the transistor 33 each have a potential VDET. Here, in the case where the potential VBG1 is supplied to the back gates of the transistor 21[1] to the transistor 21[n], the transistor 21[1] to the transistor 21[n] each have a threshold voltage of Vth1. In the case where the potential VBG2 is supplied to the back gates of the transistor 31[1] to the transistor 31[n], the transistor 31[1] to the transistor 31[n] each have a threshold voltage of Vth2. In that case, the reference potential VREF1 becomes a potential "VDET+Vth1" and the reference potential VREF2 becomes a potential "VDET+Vth2". When the threshold voltage Vth1 is higher than the threshold voltage Vth2, the reference potential VREF1 can be higher than the reference potential VREF2.

The back gate of the transistor 22 is electrically connected to the gate of the transistor 22. The back gate of the transistor 23 is electrically connected to the gate of the transistor 23. The back gate of the transistor 32 is electrically connected to the gate of the transistor 32. The back gate of the transistor 33 is electrically connected to the gate of the transistor 33. When the gate and the back gate of the transistor functioning as a switch are electrically connected to each other in this manner, the on-state current of the transistor can be increased. This allows the semiconductor device 10 to be driven at high speed. Even in the case where the transistor 21[1] to the transistor 21[n] and the transistor 31[1] to the transistor 31[n] do not include back gates, the transistor 22, the transistor 23, the transistor 32, and the transistor 33 may include back gates. The back gate and the gate are not necessarily electrically connected to each other, and the potentials of the back gate and the gate may be controlled independently.

For an example of the driving method of the semiconductor device 10 illustrated in FIG. 10, the description made with reference to FIG. 2 to FIG. 9 can be referred to when the potential VDET1 and the potential VDET2 are replaced with the potential VDET, the reference potential VREF1 is set to the potential "VDET+Vth1", and the reference potential VREF2 is set to the potential "VDET+Vth2".

Figure 11:
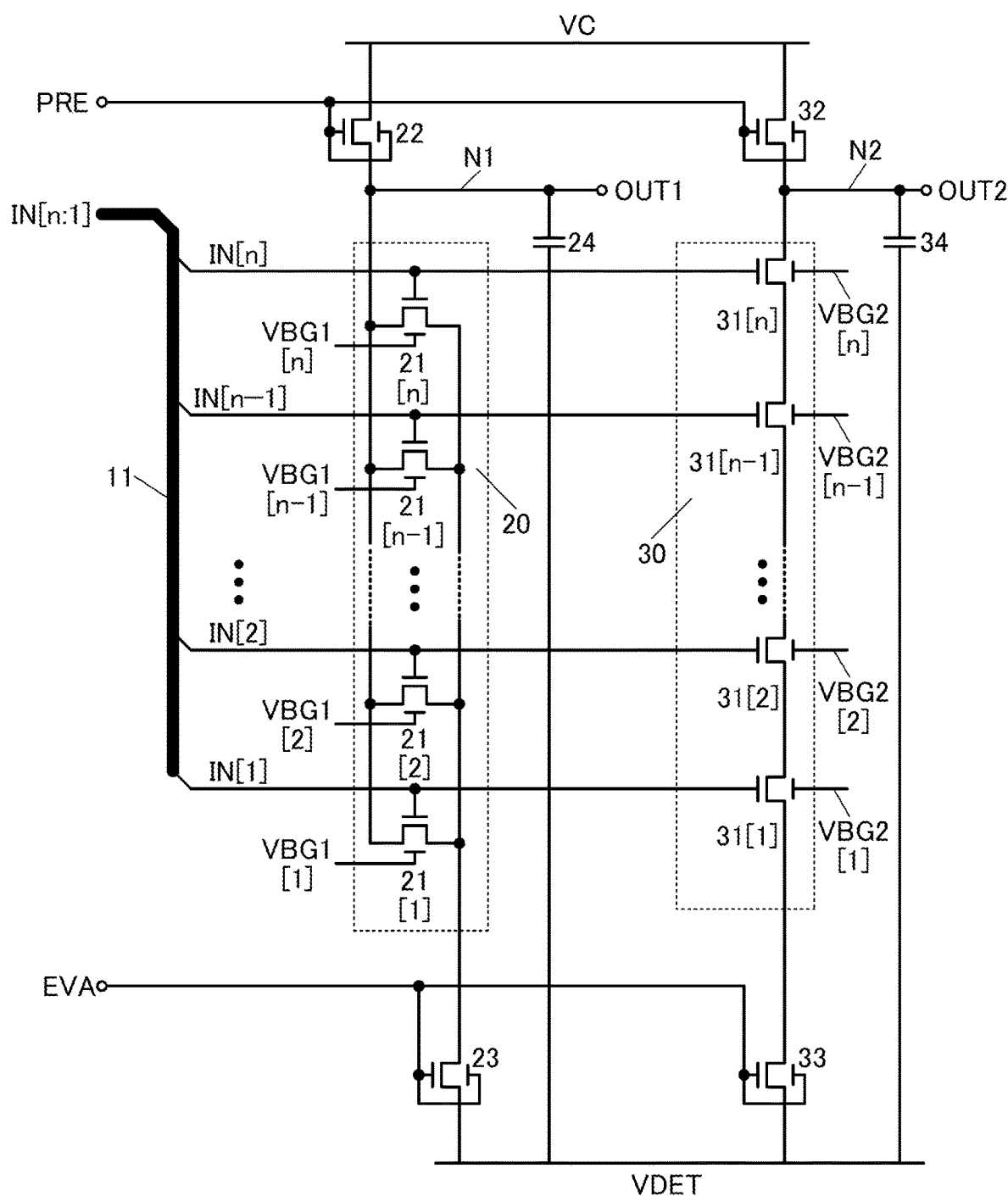
FIG. 11 is a circuit diagram showing a structure example of a semiconductor device.

FIG. 11 is a diagram illustrating a structure example of the semiconductor device 10, which is a modification example of the structure illustrated in FIG. 10. The semiconductor device 10 illustrated in FIG. 11 is different from the semiconductor device 10 illustrated in FIG. 10 in that potentials supplied to the back gates of the transistor 21[1] to the transistor 21[n] are controlled independently and potentials supplied to the back gates of the transistor 31[1] to the transistor 31[n] are controlled independently.

In the semiconductor device 10 illustrated in FIG. 11, the other of the source and the drain of the transistor 23 and the other of the source and the drain of the transistor 33 can have the same potential (e.g., the potential VDET) and variations in the threshold voltages among the transistor 21[1] to the transistor 21[n] and among the transistor 31[1] to the transistor 31[n] can also be corrected. Thus, in the semiconductor device 10 illustrated in FIG. 11, the potential levels of the signal IN[1] to the signal IN[n] can be sensed at high accuracy.

<Structure Example of Generation Circuit of Signal IN>

Next, generation of the signal IN[1] to the signal IN[n] will be described. The signal IN[1] to the signal IN[n] can be signals corresponding to signals output from pixels included in an imaging device, for example. FIG. 12A is a diagram illustrating a structure example of a circuit that has a function of generating the signal IN[i]. FIG. 12A illustrates a pixel circuit 50 and a circuit 40. A specific structure example of the circuit 40 is also illustrated. The circuit 40 includes a capacitor 41 and a transistor 42.

The pixel circuit 50 has a function of outputting a signal OUTPX. The signal OUTPX can be a signal that indicates imaging data obtained by the pixel circuit 50. The signal OUTPX is supplied to one electrode of the capacitor 41. The other electrode of the capacitor 41 is electrically connected to one of a source and a drain of the transistor 42 at a node N3. The signal IN[i] is output from the node N3. A potential VR is supplied to the other of the source and the drain of the transistor 42. A signal RES is supplied to a gate of the transistor 42. The signal RES has a function of controlling on and off of the transistor 42. The transistor 42 has a function of a switch that is turned on or off by the signal RES.

An example of a driving method of the circuit 40 will be described below with reference to FIG. 12B1 and FIG. 12B2. FIG. 12B1 illustrates a state of the circuit 40 in a period T01, and FIG. 12B2 illustrates a state of the circuit 40 in a period T02. In FIG. 12B1 and FIG. 12B2, a cross is put on a transistor that is in an off state. Meanwhile, no cross is put on a transistor that is in an on state.

First, in the period T01, the transistor 42 is turned on as illustrated in FIG. 12B1. Thus, the potential of the signal IN[i] becomes the potential VR regardless of the potential of the signal OUTPX. In other words, the potential of the signal IN[i] is reset to the potential VR. Thus, it can be said that the transistor 42 is a reset transistor and the signal RES is a reset signal. Note that the potential of the signal OUTPX is a potential VD1 in the period T01.

Next, in the period T02, the transistor 42 is turned off as illustrated in FIG. 12B2. Thus, the node N3 is brought into a floating state, so that the potential of the node N3, which is electrically connected to the other electrode of the capacitor 41, changes in response to a change in the potential of the signal OUTPX supplied to the one electrode of the capacitor 41. Accordingly, the potential of the signal IN[i] changes in response to a change in the potential of the signal OUTPX.

In FIG. 12B2, the potential of the signal OUTPX changes from the potential VD1 to a potential VD2 in the period T02. Note that in FIG. 12B2, the signal OUTPX is surrounded by a dashed-dotted line in order to show that the potential of the signal OUTPX in the period T02 is different from that of the signal OUTPX in the period T01. In addition, the signal IN[i] is surrounded by a dashed-dotted line in order to show that the potential of the signal IN[i] in the period T02 is different from that of the signal IN[i] in the period T01.

Here, in the case where the capacitance of the capacitor 41 is sufficiently larger than the parasitic capacitance of the node N3 such as the gate capacitance of the transistor 42, the capacitive coupling coefficient of the node N3 can be regarded as 1. Assuming that the capacitive coupling coefficient of the node N3 is 1, the variation width of the potential of the signal IN[i] is equal to that of the signal OUTPX in the case where the transistor 42 is in an off state. Thus, when the potential of the signal OUTPX changes from the potential VD1 to the potential VD2 in the period T02 and the capacitive coupling coefficient of the node N3 is 1, the potential of the signal IN[i] is a potential "VR+VD2−VD1".

The potential VR is higher than or equal to the reference potential VREF2 and lower than or equal to the reference potential VREF1. For example, the potential VR is a potential "(VREF1+VREF2)/2". After the period T02, the operation in the period T11 and the operation in the period T12, which are illustrated in FIG. 2 and the like, are performed. Accordingly, the semiconductor device 10 can sense that at least one of the potentials of the signal IN[1] to the signal IN[n] is higher than the reference potential VREF1 and lower than or equal to the reference potential VREF2. Alternatively, the semiconductor device 10 can sense that each of the potentials of the signal IN[1] to the signal IN[n] is higher than the reference potential VREF2 and lower than or equal to the reference potential VREF1. Thus, it can be sensed in the period T12 whether there is a signal whose potential has been changed by a predetermined value or more among the signal IN[1] to the signal IN[n].

<Structure Example of Pixel Circuit>

Figure 13A:
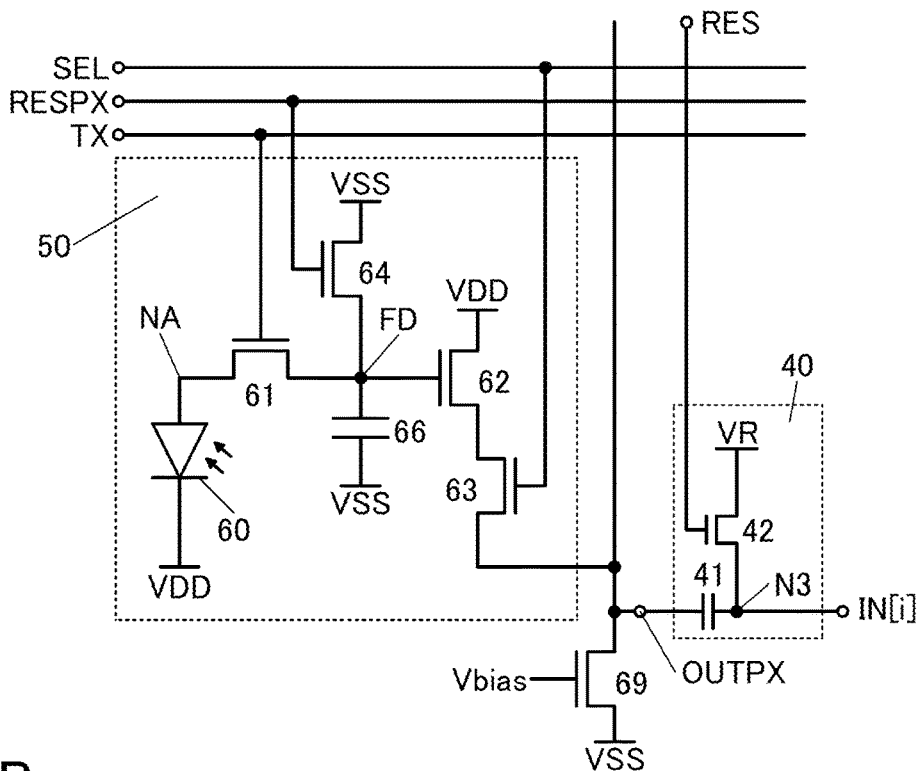
FIG. 13A is a circuit diagram showing a structure example of a pixel included in an imaging device.

FIG. 13A is diagram illustrating a structure example of the pixel circuit 50. Note that in FIG. 13A, the circuit 40 having the structure illustrated in FIG. 12A is also illustrated for convenience of description.

The pixel circuit 50 includes a photoelectric conversion device 60, a transistor 61, a transistor 62, a transistor 63, a transistor 64, and a capacitor 66.

The following description is made on the assumption that the transistor 42 and the transistor 61 to the transistor 64 are all n-channel transistors. Even when some or all of the transistor 42 and the transistor 61 to the transistor 64 are p-channel transistors, the following description can be referred to by, for example, changing the magnitude relation of potentials.

One electrode of the photoelectric conversion device 60 is electrically connected to one of a source and a drain of the transistor 61. In FIG. 13A, the one electrode of the photoelectric conversion device 60 is an anode and the other electrode of the photoelectric conversion device 60 is a cathode.

The other of the source and the drain of the transistor 61 is electrically connected to a gate of the transistor 62. The gate of the transistor 62 is electrically connected to one of a source and a drain of the transistor 64. The one of the source and the drain of the transistor 64 is electrically connected to one electrode of the capacitor 66. One of a source and a drain of the transistor 62 is electrically connected to one of a source and a drain of the transistor 63.

A node where the one electrode of the photoelectric conversion device 60 and the one of the source and the drain of the transistor 61 are electrically connected to each other is referred to as a node NA. A node where the other of the source and the drain of the transistor 61, the gate of the transistor 62, the one of the source and the drain of the transistor 64, and the one electrode of the capacitor 66 are electrically connected to each other is referred to as a node FD. Note that the capacitor 66 is not necessarily provided if the transistor 62 has sufficiently large gate capacitance and the node FD can have sufficient capacitance without the capacitor 66.

A signal TX is supplied to a gate of the transistor 61. A signal SEL is supplied to a gate of the transistor 63. A signal RESPX is supplied to a gate of the transistor 64. The signal OUTPX is output from the other of the source and the drain of the transistor 63.

In the case where the one electrode of the photoelectric conversion device 60 is the anode and the other electrode of the photoelectric conversion device 60 is the cathode as illustrated in FIG. 13A, a potential VDD can be supplied to the other electrode of the photoelectric conversion device 60 and the other of the source and the drain of the transistor 62. Meanwhile, a potential VSS can be supplied to the other of the source and the drain of the transistor 64 and the other electrode of the capacitor 66. Here, the potential VDD can be a high potential and the potential VSS can be a low potential. Note that in the case where the one electrode of the photoelectric conversion device 60 is the cathode and the other electrode of the photoelectric conversion device 60 is the anode, the potential VDD can be supplied to the other of the source and the drain of the transistor 62 and the other of the source and the drain of the transistor 64. Furthermore, the potential VSS can be supplied to the other electrode of the photoelectric conversion device 60 and the other electrode of the capacitor 66.

The other of the source and the drain of the transistor 63 is electrically connected to one of a source and a drain of a transistor 69. The potential VSS can be supplied to the other of the source and the drain of the transistor 69. A potential Vbias can be supplied to a gate of the transistor 69. The potential Vbias is a potential that enables the transistor 69 to function as a current source. For example, the potential Vbias is a potential that enables the transistor 69 to operate in a saturation region. The potential Vbias can be referred to as a bias potential and the transistor 69 can be referred to as a bias transistor.

Figure 13B:
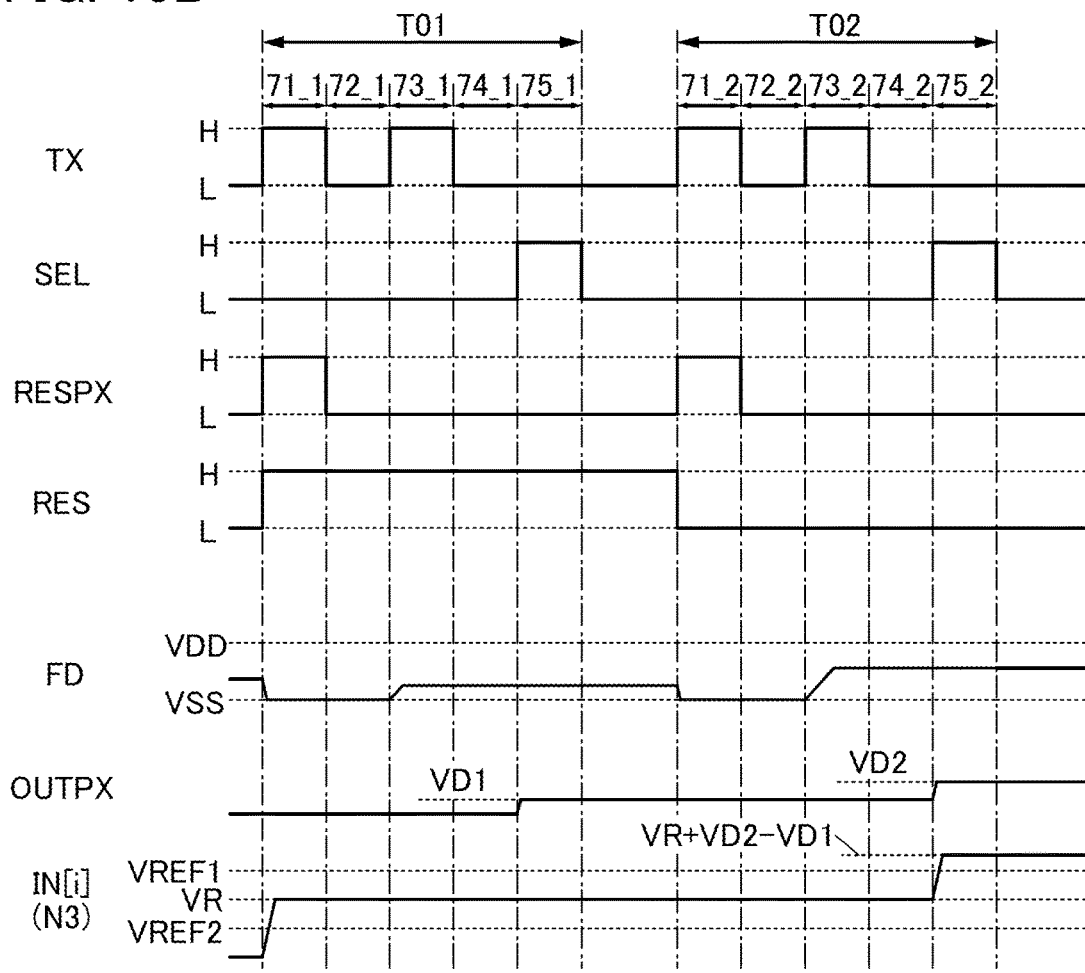
FIG. 13B is a timing chart showing an example of a driving method of the imaging device.

FIG. 13B is a timing chart showing an example of the driving method of the pixel circuit 50 and the circuit 40 having the structure illustrated in FIG. 13A. FIG. 13B illustrates operation of the period T01 illustrated in FIG. 12B1 and operation of the period T02 illustrated in FIG. 12B2. Here, in FIG. 13B, the period T01 is divided into a period 71_1 to a period 75_1 and the period T02 is divided into a period 71_2 to a period 75_2.

First, an example of the operation in the period T01 is described. In the period 71_1, the signal TX, the signal RESPX, and the signal RES are set at a high potential, and the signal SEL is set at a low potential. Thus, the transistor 61, the transistor 64, and the transistor 42 are turned on and the transistor 63 is turned off. When the transistor 64 is turned on, the potential of the node FD becomes the potential VSS. When not only the transistor 64 but also the transistor 61 is turned on, the potential of the node NA also becomes the potential VSS. Furthermore, the potential of the signal IN[i] becomes the potential VR when the transistor 42 is turned on. Here, the potential VR is higher than or equal to the reference potential VREF2 and lower than or equal to the reference potential VREF1.

In the period 71_2, the signal TX and the signal RESPX are set at a low potential. Thus, the transistor 61 and the transistor 64 are turned off. When the photoelectric conversion device 60 is irradiated with light in that state, electric charge corresponding to the illuminance of the light is accumulated in the node NA.

In a period 73_1, the signal TX is set at a high potential. Thus, the transistor 61 is turned on and the electric charge accumulated in the node NA is transferred to the node FD. Accordingly, the potential of the node FD is increased.

In a period 74_1, the signal TX is set at a low potential. Thus, the transistor 61 is turned off and the transfer of the electric charge from the node NA to the node FD is ended. Thus, the pixel circuit 50 can obtain imaging data.

In the period 75_1, the signal SEL is set at a high potential. Thus, the transistor 63 is turned on and the imaging data obtained in the pixel circuit 50 is read out as the signal OUTPX. Specifically, the potential of the signal OUTPX becomes a potential corresponding to the potential of the node FD. In FIG. 13B, the potential of the signal OUTPX becomes the potential VD1. Since the transistor 42 is in an on state, the potential of the signal IN[i] becomes the potential VR regardless of the height of the potential VD1. The above is an example of the operation of the pixel circuit 50 and the circuit 40 having the structure illustrated in FIG. 13A in the period T01.

Although the signal RES is set at a high potential in the period 71_1 in FIG. 13B, the signal RES may be set at a high potential anytime before the start of the period 75_1. That is, the signal RES may be changed from a low potential to a high potential anytime from the period 71_1 to the period 74_1.

Next, an example of the operation in the period T02 is described. The potentials of the signal TX, the signal SEL, and the signal RESPX in the period 71_2 to the period 75_2 are similar to those in the period 71_1 to the period 75_1. In the period 71_2 to a period 74_2, the potential of the signal RES is changed from a high potential to a low potential. Thus, in the period 75_2, the signal OUTPX with the potential VD2 is output from the pixel circuit 50. Accordingly, the imaging data obtained in the pixel circuit 50 in the period 71_2 to the period 74_2 is read out from the pixel circuit 50 in the period 75_2.

In the period 75_2, the transistor 42 is in an off state because the signal RES has a low potential. Hence, the potential of the signal IN[i] is the potential "VR+VD2−VD1" when the capacitive coupling coefficient of the node N3 is 1. The above is an example of the operation of the pixel circuit 50 and the circuit 40 having the structure illustrated in FIG. 13A in the period T02.

As described above, after the period T02, the operation in the period T11 and the operation in the period T12, which are illustrated in FIG. 2 and the like, are performed. In the case of FIG. 13B, the potential of the signal IN[i] is higher than the reference potential VREF1 at the end of the period T02. Thus, in the period T12, the semiconductor device 10 outputs the potential VDET1 as the signal OUT1.

In the pixel circuit 50, obtaining and reading out of imaging data are performed in the period T01 and obtaining and reading out of imaging data are performed again in the period T02. Hence, the period T01 and the period T02 can each be referred to as one frame period. When the period T01 is referred to as a first frame period and the period T02 is referred to as a second frame period, the semiconductor device 10 can sense whether the difference between the imaging data obtained in the first frame period and the imaging data obtained in the second frame period, both of which are obtained by the imaging device including the pixel circuit 50, is larger than or equal to a predetermined value.

<Structure Example of Imaging Device>

Figure 14:
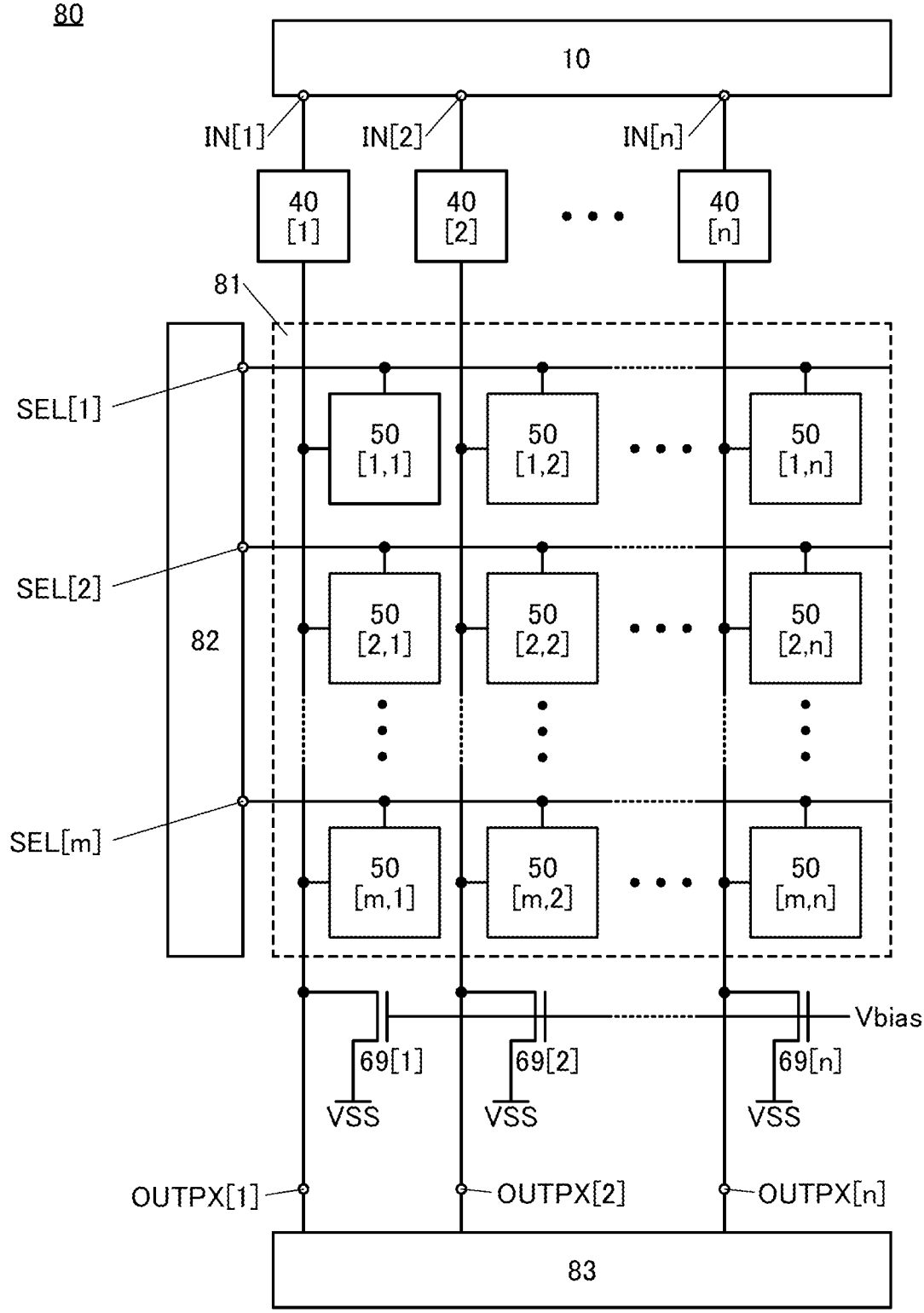
FIG. 14 is a block diagram showing a structure example of an imaging device.

FIG. 14 is a block diagram illustrating a structure example of an imaging device 80, which is an imaging device including the semiconductor device 10, the circuit 40, and the pixel circuit 50. The imaging device 80 includes a pixel portion 81, a gate driver circuit 82, a data driver circuit 83, and the transistor 69, in addition to the semiconductor device 10 and the circuit 40. In the pixel portion 81, the pixel circuits 50 are arranged in a matrix of m rows and n columns (m and n are each an integer of 1 or more). In this specification and the like, for example, the pixel circuit 50 in an h-th row and an i-th column (h is an integer greater than or equal to 1 and less than or equal to m and i is an integer greater than or equal to 1 and less than or equal to n) is denoted as a pixel circuit 50[h,i].

In this specification and the like, an imaging device including a semiconductor device of one embodiment of the present invention is referred to as an imaging device of one embodiment of the present invention in some cases. For example, the imaging device 80, which includes the semiconductor device 10 of one embodiment of the present invention, can be referred to as an imaging device of one embodiment of the present invention.

The gate driver circuit 82 has a function of generating the signal SEL. Here, the same signal SEL can be supplied to the pixel circuits 50 in the same row. In this specification and the like, for example, the signal SEL supplied to the pixel circuits 50 in the h-th row is denoted as a signal SEL[h]. Note that the gate driver circuit 82 may have a function of generating the signal RESPX. The gate driver circuit 82 may also have a function of generating the signal TX.

The data driver circuit 83 has a function of outputting the imaging data read out from the pixel circuit 50 to the outside of the imaging device 80. Specifically, the data driver circuit 83 has a function of outputting the imaging data to the outside of the imaging device 80 on the basis of the signal OUTPX output from the pixel circuit 50. Here, the data driver circuit 83 can read out the imaging data from each column of the pixel circuits 50. In this specification and the like, for example, the signal OUTPX output from the pixel circuits 50 in the i-th column is denoted as a signal OUTPX[i].

The transistor 69 and the circuit 40 can be provided for each column of the pixel circuits 50. Accordingly, the number of transistors 69 and the number of circuits 40 can each be equal to the number of columns of the pixel circuits 50 in the imaging device 80. Thus, for example, n transistors 69 and n circuits 40 can be provided in the imaging device 80. In this specification and the like, for example, the transistor 69 electrically connected to the pixel circuits 50 in the i-th column is denoted as a transistor 69[i]. For another example, the circuit 40 supplied with the signal OUTPX[i] is denoted as a circuit 40[i]. Here, for example, the signal IN[i] is output from the circuit 40[i]. The signal IN[1] to the signal IN[n] can be supplied to the semiconductor device 10.

When the imaging device 80 has the structure illustrated in FIG. 14, the semiconductor device 10 can sense whether there is a signal OUTPX with a potential higher than the reference potential VREF1 or a signal OUTPX with a potential lower than or equal to the reference potential VREF2 among a signal OUTPX[1] to a signal OUTPX[n] output from a pixel circuit 50[h,1] to a pixel circuit 50[h,n].

Thus, when the pixel circuit 50 and the circuit 40 are driven by the method illustrated in FIG. 13B and the like, the presence of the pixel circuit 50 in which the difference between the imaging data obtained in the first frame period and the imaging data obtained in the second frame period is larger than or equal to a predetermined value can be sensed by the semiconductor device 10 in each row of the pixel circuits 50. For example, it is possible to sense whether there is the pixel circuit 50 in which the difference between the imaging data obtained in the first frame period and the imaging data obtained in the second frame period is larger than or equal to a predetermined value among the pixel circuit 50[$h$,1] to the pixel circuit 50[$h$,$n$]. Note that for example, when there is the pixel circuit 50 in which the difference between the imaging data obtained in the first frame period and the imaging data obtained in the second frame period is larger than or equal to a predetermined value, the occurrence of an event in the second frame period can be determined.

The configurations, structures, methods, and the like described in this embodiment can be used in combination as appropriate with the configurations, structures, methods, and the like described in the other embodiments.

Embodiment 2

In this embodiment, structure examples of transistors that can be used in the semiconductor device described in the above embodiment will be described.

Structure Example_1 of Transistor

Figure 15A:
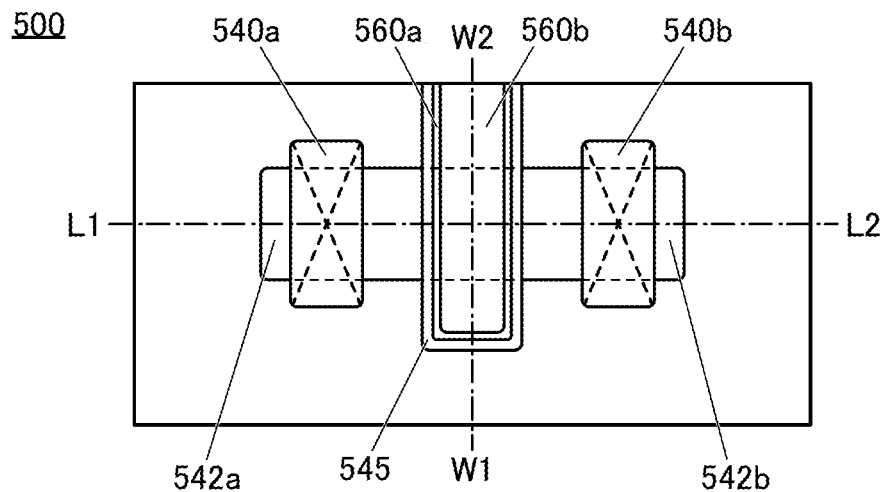
FIG. 15A to FIG. 15C are diagrams illustrating a structure example of a transistor.
Figure 15B:
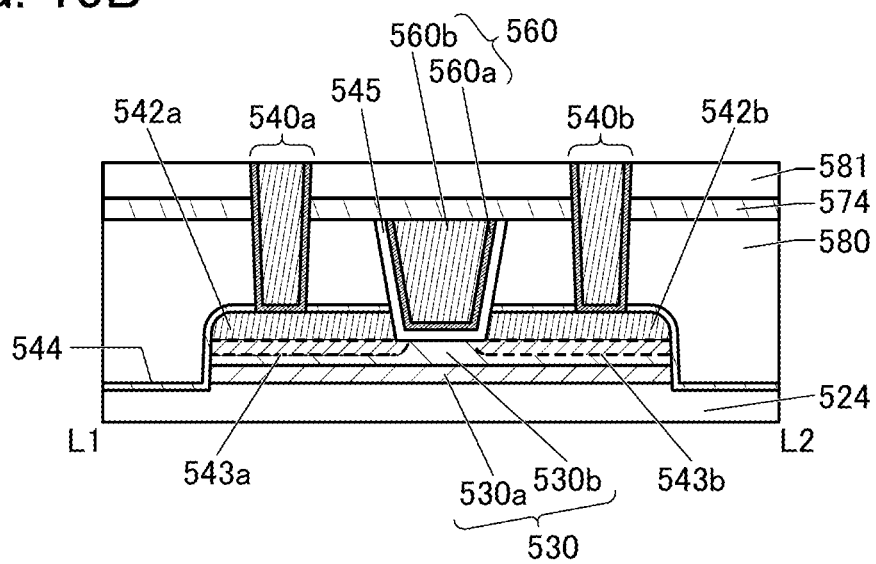
Figure 15C:
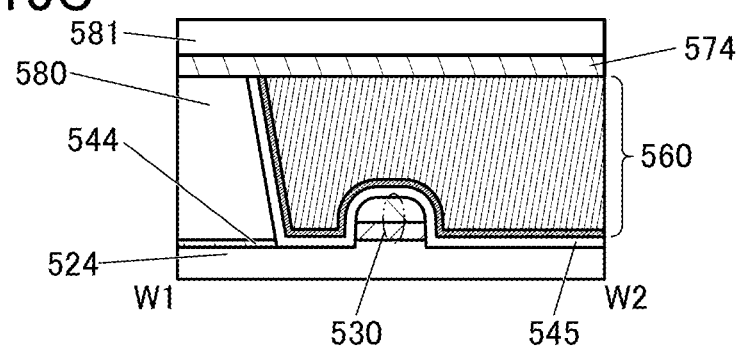

FIG. 15A, FIG. 15B, and FIG. 15C are diagrams illustrating a structure example of a transistor 500 that can be used in the semiconductor device described in the above embodiment. FIG. 15A is a top view of the transistor 500. FIG. 15B is a cross-sectional view of a portion indicated by a dashed-dotted line L1-L2 in FIG. 15A, and is a cross-sectional view in the channel length direction of the transistor 500. FIG. 15C is a cross-sectional view of a portion indicated by a dashed-dotted line W1-W2 in FIG. 15A, and is a cross-sectional view in the channel width direction of the transistor 500. Note that for clarity of the drawing, some components are not illustrated in the top view in FIG. 15A.

As illustrated in FIG. 15A to FIG. 15C, the transistor 500 includes an insulating layer 524 positioned over a substrate (not illustrated); an oxide 530a positioned over the insulating layer 524; an oxide 530b positioned over the oxide 530a; a conductive layer 542a and a conductive layer 542b positioned apart from each other over the oxide 530b; an insulating layer 580 that is positioned over the conductive layer 542a and the conductive layer 542b and is provided with an opening formed to overlap with a region between the conductive layer 542a and the conductive layer 542b; an insulating layer 545 positioned on a bottom surface and a side surface of the opening; and a conductive layer 560 positioned on a formation surface of the insulating layer 545.

In addition, as illustrated in FIG. 15B and FIG. 15C, an insulating layer 544 is preferably positioned between the insulating layer 580 and the oxide 530a, the oxide 530b, the conductive layer 542a, and the conductive layer 542b. Furthermore, as illustrated in FIG. 15B and FIG. 15C, the conductive layer 560 preferably includes a conductive layer 560a provided inside the insulating layer 545 and a conductive layer 560b provided to be embedded inside the conductive layer 560a. As illustrated in FIG. 15B and FIG. 15C, an insulating layer 574 is preferably positioned over the insulating layer 580, the conductive layer 560, and the insulating layer 545.

Note that in this specification and the like, the oxide 530a and the oxide 530b are sometimes collectively referred to as an oxide 530.

Although a structure of the transistor 500 in which two layers of the oxide 530a and the oxide 530b are stacked in a region where a channel is formed and its vicinity is shown, the present invention is not limited thereto. For example, a single layer of the oxide 530b or a stacked-layer structure of three or more layers may be employed.

Although the conductive layer 560 is illustrated to have a stacked-layer structure of two layers in the transistor 500, the present invention is not limited thereto. For example, the conductive layer 560 may have a single-layer structure or a stacked-layer structure of three or more layers.

Here, the conductive layer 560 functions as a gate electrode of the transistor 500. The conductive layer 542a functions as one of a source electrode and a drain electrode of the transistor 500, and the conductive layer 542b functions as the other of the source electrode and the drain electrode of the transistor 500. As described above, the conductive layer 560 is formed to be embedded in the opening of the insulating layer 580, which is formed in a region positioned between the conductive layer 542a and the conductive layer 542b. The positions of the conductive layer 560, the conductive layer 542a, and the conductive layer 542b with respect to the opening of the insulating layer 580 are selected in a self-aligned manner. That is, in the transistor 500, the gate electrode can be positioned between the source electrode and the drain electrode in a self-aligned manner. Therefore, the conductive layer 560 can be formed without an alignment margin, resulting in a reduction in the area occupied by the transistor 500. Accordingly, miniaturization and high integration of the semiconductor device can be achieved.

For miniaturization of the semiconductor device, the gate length needs to be short. Meanwhile, it is necessary to prevent a reduction in the conductivity of the conductive layer 560. When the conductive layer 560 is made thick in order to prevent a reduction in the conductivity of the conductive layer 560, the conductive layer 560 might have a shape with a high aspect ratio. As described above, in the transistor 500, the conductive layer 560 is provided to be embedded in the opening of the insulating layer 580. This allows the transistor 500 to be formed without damaging the conductive layer 560 during a process even when the conductive layer 560 has a shape with a high aspect ratio.

Since the conductive layer 560 is formed in the region between the conductive layer 542a and the conductive layer 542b in a self-aligned manner, the conductive layer 560 does not have a region overlapping with the conductive layer 542a or the conductive layer 542b. Thus, parasitic capacitance formed between the conductive layer 560 and each of the conductive layer 542a and the conductive layer 542b can be reduced. As a result, the switching speed of the transistor 500 can be improved, and the transistor 500 can have high frequency characteristics.

In the transistor 500, a metal oxide functioning as an oxide semiconductor is used as the oxide 530 including a channel formation region. Note that the oxide semiconductor preferably contains at least one of In and Zn. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used.

The metal oxide functioning as an oxide semiconductor may be formed by a sputtering method or an ALD (Atomic Layer Deposition) method. Note that the metal oxide functioning as an oxide semiconductor will be described in detail in another embodiment.

As the metal oxide functioning as the channel formation region in the oxide 530, a metal oxide whose band gap is greater than or equal to 2 eV is preferably used, and a metal oxide whose band gap is greater than or equal to 2.5 eV is more preferably used. The use of a metal oxide having such a wide band gap can reduce the off-state current of a transistor.

When the oxide 530a is provided under the oxide 530b in the oxide 530, impurities can be inhibited from diffusing into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to constituent elements in the metal oxide used as the oxide 530a is preferably higher than the atomic ratio of the element M to constituent elements in the metal oxide used as the oxide 530b. Moreover, the atomic ratio of the element M to In in the metal oxide used as the oxide 530a is preferably higher than the atomic ratio of the element M to In in the metal oxide used as the oxide 530b. Moreover, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum is gradually varied at a junction portion of the oxide 530a and the oxide 530b. In other words, the energy level of the conduction band minimum at a junction portion of the oxide 530a and the oxide 530b is continuously varied or continuously connected. To achieve this, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

As illustrated in FIG. 15B and FIG. 15C, the insulating layer 524 can be provided so as to include a region in contact with the oxide 530. In the case where the insulating layer 524 includes the region in contact with the oxide 530, an insulator that contains oxygen more than oxygen in the stoichiometric composition is preferably used as the insulating layer 524. Such oxygen is easily released from the film by heating. In this specification and the like, oxygen released by heating is referred to as "excess oxygen" in some cases. That is, a region containing excess oxygen (also referred to as an "excess-oxygen region") is preferably formed in the insulating layer 524. When such an insulating layer containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Hydrogen in the oxide semiconductor is easily transferred by a stress such as heat or an electric field; thus, a large amount of hydrogen in the oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. In order to obtain such an oxide semiconductor with sufficiently reduced $V_O H$, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced impurities such as $V_O H$ is used for a channel formation region of a transistor, the transistor can have stable electrical characteristics.

In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

As the insulator including an excess-oxygen region, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of $V_O H \rightarrow V_O + H$ occurs. Part of hydrogen generated at this time is bonded to oxygen to be $H_2 O$, and removed from the oxide 530 or an insulating layer near the oxide 530 in some cases. Part of hydrogen is sometimes gettered by the conductive layer 542a or the conductive layer 542b.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated. Application of the RF to the substrate side allows the oxygen radicals generated by the high-density plasma to be efficiently introduced into the oxide 530 or an insulating layer in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

The oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

The conductive layer 542a and the conductive layer 542b functioning as the source electrode and the drain electrode are provided over the oxide 530b. For the conductive layer 542a and the conductive layer 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

Although the conductive layer 542a and the conductive layer 542b are illustrated to have a single-layer structure in FIG. 15, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 15B, a region 543a is sometimes formed as a low-resistance region at and near the interface between the oxide 530 and the conductive layer 542a. In addition, a region 543b is sometimes formed as a low-resistance region at and near the interface between the oxide 530 and the conductive layer 542b. In that case, the region 543a functions as one of a source region and a drain region, and the region 543b functions as the other of the source region and the drain region. A channel formation region is formed in a region between the region 543a and the region 543b.

When the conductive layer 542a and the conductive layer 542b are provided in contact with the oxide 530, the oxygen concentration of the region 543a and the region 543b sometimes decreases. In addition, a metal compound layer that contains the metal contained in the conductive layer 542a and the component of the oxide 530 is sometimes formed in the region 543a. Furthermore, a metal compound layer that contains the metal contained in the conductive layer 542b and the component of the oxide 530 is sometimes formed in the region 543b. In that case, the carrier density of the region 543a and the region 543b increases and the electric resistance of the region 543a and the region 543b decreases.

The insulating layer 544 is provided to cover the conductive layer 542a and the conductive layer 542b and has a function of inhibiting oxidation of the conductive layer 542a and the conductive layer 542b. Here, the insulating layer 544 may be provided to cover the side surface of the oxide 530 and to be in contact with the insulating layer 524.

A metal oxide containing one or more of hafnium, aluminum, gallium, yttrium, zirconium, tungsten, titanium, tantalum, nickel, germanium, neodymium, lanthanum, magnesium, and the like can be used as the insulating layer 544. For the insulating layer 544, silicon nitride oxide or silicon nitride can be used, for example.

In particular, aluminum oxide or hafnium oxide, which is an insulator containing an oxide of one or both of aluminum and hafnium, is preferably used as the insulating layer 544. Alternatively, it is preferable to use an oxide containing aluminum and hafnium (hafnium aluminate) or the like. In particular, hafnium aluminate has higher heat resistance than a hafnium oxide film. Thus, hafnium aluminate is preferable because it is less likely to be crystallized by heat treatment in a later step. Note that the insulating layer 544 is not necessarily provided when the conductive layer 542a and the conductive layer 542b are oxidation-resistant materials or do not significantly lose the conductivity even after absorbing oxygen. Design is determined as appropriate in consideration of required transistor characteristics.

The insulating layer 544 can inhibit impurities such as water and hydrogen contained in the insulating layer 580 from diffusing into the oxide 530b. Moreover, the oxidation of the conductive layer 560 due to excess oxygen contained in the insulating layer 580 can be inhibited.

The insulating layer 545 functions as a gate insulating film for the conductive layer 560. The insulating layer 545 is preferably formed using an insulator that contains excess oxygen and from which oxygen is released by heating, like the insulating layer 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

In this specification, silicon oxynitride refers to a material that has a higher oxygen content than a nitrogen content, and silicon nitride oxide refers to a material that has a higher nitrogen content than an oxygen content. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

When an insulator containing excess oxygen is provided as the insulating layer 545, oxygen can be effectively supplied from the insulating layer 545 to the channel formation region of the oxide 530b. The concentration of impurities such as water and hydrogen in the insulating layer 545 is preferably lowered. The thickness of the insulating layer 545 is preferably greater than or equal to 1 nm and less than or equal to 20 nm.

Furthermore, in order that excess oxygen contained in the insulating layer 545 can be efficiently supplied to the oxide 530, a metal oxide may be provided between the insulating layer 545 and the conductive layer 560. The metal oxide preferably has a composition that inhibits diffusion of oxygen from the insulating layer 545 into the conductive layer 560. Providing the metal oxide that inhibits diffusion of oxygen between the insulating layer 545 and the conductive layer 560 inhibits diffusion of excess oxygen from the insulating layer 545 into the conductive layer 560. That is, a reduction in the amount of excess oxygen supplied to the oxide 530 can be inhibited. Moreover, oxidization of the conductive layer 560 due to excess oxygen can be inhibited.

Note that the insulating layer 545 may have a stacked-layer structure. As miniaturization and high integration of transistors progress, a problem such as leakage current might arise because of a thinner gate insulating film. Thus, when an insulating layer functioning as a gate insulating film has a stacked-layer structure of a high-k material and a thermally stable material, a gate potential at the time of driving the transistor can be reduced while the physical thickness of the gate insulating film is kept.

Although the conductive layer 560 functioning as the first gate electrode is illustrated to have a two-layer structure in FIG. 15B and FIG. 15C, the conductive layer 560 may have a single-layer structure or a stacked-layer structure of three or more layers.

The conductive layer 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductive layer 560a is preferably formed using a conductive material having a function of inhibiting diffusion of oxygen (e.g., at least one of oxygen atoms, oxygen molecules, and the like). When the conductive layer 560a has a function of inhibiting diffusion of oxygen, the conductivity of the conductive layer 560b can be inhibited from being lowered because of oxidization due to oxygen contained in the insulating layer 545. As a conductive material having a function of inhibiting diffusion of oxygen, for example, tantalum, tantalum nitride, ruthenium, or ruthenium oxide is preferably used. The conductive layer 560a can be formed using an oxide semiconductor that can be used for the oxide 530. In that case, when the conductive layer 560b is formed by a sputtering method, the conductive layer 560a can have a reduced electric resistance value. Such a conductive layer can be referred to as an OC (Oxide Conductor) electrode.

Furthermore, the conductive layer 560b is preferably formed using a conductive material containing tungsten, copper, or aluminum as its main component. The conductive layer 560b also functions as a wiring and thus is preferably a conductor having low electric resistance. For example, a conductive material containing tungsten, copper, or aluminum as its main component can be used. The conductive layer 560b may have a stacked-layer structure, for example, a stacked-layer structure of titanium or titanium nitride and the above conductive material.

The insulating layer 580 can be provided over the conductive layer 542a and the conductive layer 542b with the insulating layer 544 positioned therebetween. The insulating layer 580 preferably includes an excess-oxygen region. For example, the insulating layer 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are preferable because an excess-oxygen region can be formed easily in a later step.

The insulating layer 580 preferably includes an excess-oxygen region. When the insulating layer 580 from which oxygen is released by heating is provided, oxygen in the insulating layer 580 can be efficiently supplied to the oxide 530. The concentration of impurities such as water and hydrogen in the insulating layer 580 is preferably lowered.

The insulating layer 574 is preferably provided so as to have a region in contact with a top surface of the insulating layer 580, a top surface of the conductive layer 560, and a top surface of the insulating layer 545. When the insulating layer 574 is formed by a sputtering method, the insulating layer 545 and the insulating layer 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulating layer 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

An insulating layer 581 functioning as an interlayer film is preferably provided over the insulating layer 574. The concentration of impurities such as water and hydrogen in the insulating layer 581 is preferably lowered.

A conductive layer 540a and a conductive layer 540b are provided in the openings formed in the insulating layer 581, the insulating layer 574, the insulating layer 580, and the insulating layer 544. The conductive layer 540a and the conductive layer 540b are provided to face each other with the conductive layer 560 therebetween.

As the substrate used for the semiconductor device of one embodiment of the present invention, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including gallium nitride, silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator.

Structure Example_2 of Transistor

Figure 16A:
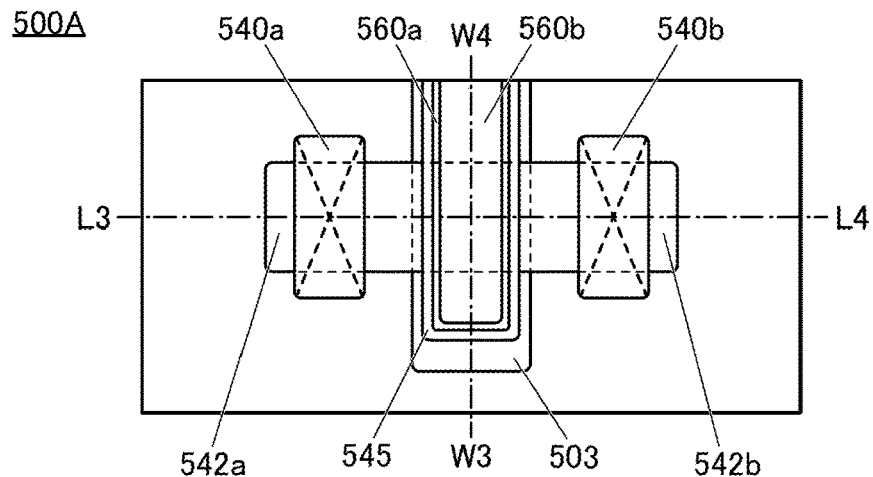
FIG. 16A to FIG. 16C are diagrams illustrating a structure example of a transistor.
Figure 16B:
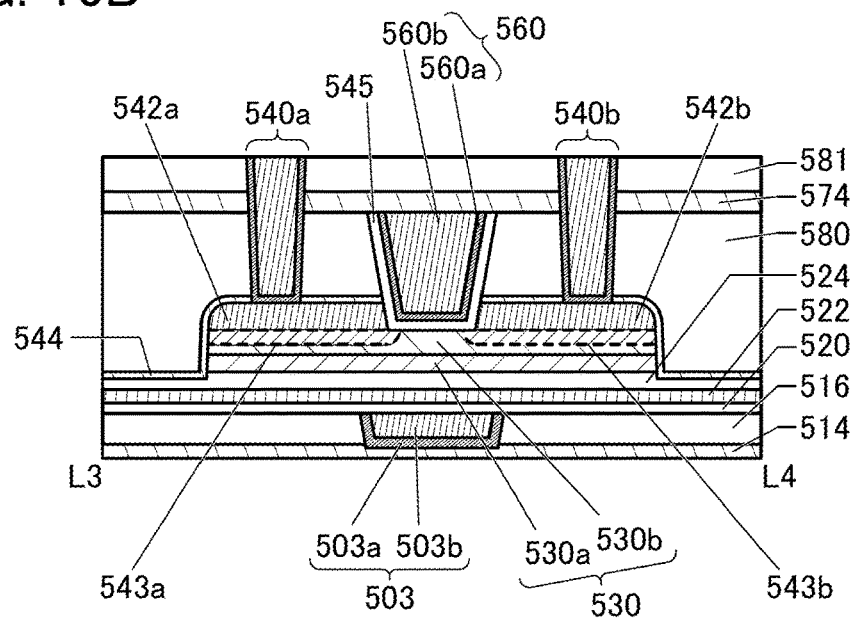
Figure 16C:
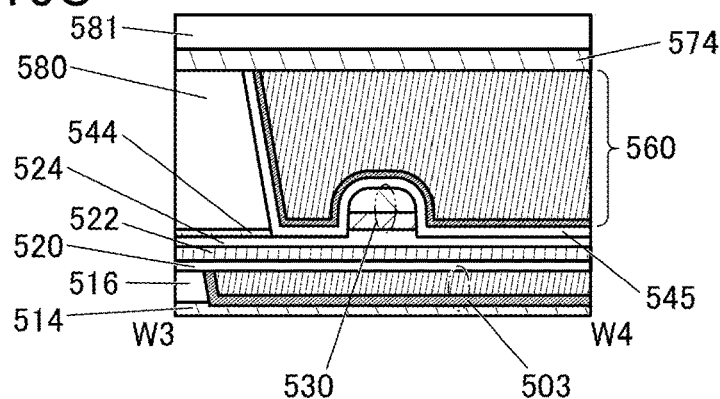

FIG. 16A, FIG. 16B, and FIG. 16C are diagrams illustrating a structure example of a transistor 500A, which is a modification example of the transistor 500. FIG. 16A is a top view of the transistor 500A. FIG. 16B is a cross-sectional view of a portion indicated by a dashed-dotted line L3-L4 in FIG. 16A, and is a cross-sectional view in the channel length direction of the transistor 500A. FIG. 16C is a cross-sectional view of a portion indicated by a dashed-dotted line W3-W4 in FIG. 16A, and is a cross-sectional view in the channel width direction of the transistor 500A. Note that for clarity of the drawing, some components are not illustrated in the top view in FIG. 16A.

The transistor 500A is different from the transistor 500 in that an insulating layer 514, an insulating layer 516, an insulating layer 520, and an insulating layer 522 are provided between a substrate (not illustrated) and the insulating layer 524, and that a conductive layer 503 is positioned to be embedded in the insulating layer 514 and the insulating layer 516. Here, the insulating layer 520 is positioned over the insulating layer 516 and the conductive layer 503, the insulating layer 522 is positioned over the insulating layer 520, and the insulating layer 524 is positioned over the insulating layer 522.

The conductive layer 503 functions as a back gate electrode. The conductive layer 503 is positioned to include a region overlapping with the oxide 530 and the conductive layer 560. Thus, in the case where potentials are supplied to the conductive layer 560 and the conductive layer 503, an electric field generated from the conductive layer 560 and an electric field generated from the conductive layer 503 are connected, so that a channel formation region formed in the oxide 530 can be electrically surrounded.

In this specification and the like, a transistor structure in which a channel formation region is electrically surrounded by the electric fields of a pair of gate electrodes (a first gate electrode and a second gate electrode) is referred to as a surrounded channel (s-channel) structure. In this specification and the like, the s-channel structure has a feature that the side surface and the vicinity of the oxide 530 in contact with the conductive layer 542a and the conductive layer 542b functioning as the source electrode and the drain electrode are of I-type like the channel formation region. Since the side surface and the vicinity of the oxide 530 in contact with the conductive layer 542a and the conductive layer 542b are in contact with the insulating layer 544, they can be of I-type like the channel formation region. Note that in this specification and the like, "I-type" can be equated with "highly purified intrinsic". The s-channel structure disclosed in this specification and the like is different from a Fin-type structure and a planar structure. With the s-channel structure, resistance to a short-channel effect can be enhanced, that is, a transistor in which a short-channel effect is unlikely to occur can be provided.

The conductive layer 503 can have a structure including a conductive layer 503a and a conductive layer 503b. The conductive layer 503a is formed in contact with an inner wall of the opening in the insulating layer 514 and the insulating layer 516, and the conductive layer 503b is formed further inside. Note that in this embodiment, the conductive layer 503 has a structure in which the conductive layer 503a and the conductive layer 503b are stacked; however, one embodiment of the present invention is not limited to this structure. For example, the conductive layer 503 may be provided as a single layer or to have a stacked-layer structure of three or more layers.

Here, for the conductive layer 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is unlikely to pass). Note that in this specification, a function of inhibiting diffusion of impurities or oxygen means a function of inhibiting diffusion of any one or all of the impurities and oxygen.

For example, when the conductive layer 503a has a function of inhibiting diffusion of oxygen, a reduction in the conductivity of the conductive layer 503b due to oxidation can be inhibited.

In the case where the conductive layer 503 also functions as a wiring, a conductive material with high conductivity that contains tungsten, copper, or aluminum as its main component is preferably used for the conductive layer 503b.

In the transistor 500A, the insulating layer 520, the insulating layer 522, and the insulating layer 524 have a function of a gate insulating film for the conductive layer 503. As described above, the insulating layer 545 also has a function of a gate insulating film. Hence, the insulating layer 545 can be referred to as a first gate insulating film, and the insulating layer 520, the insulating layer 522, and the insulating layer 524 can be referred to as a second gate insulating film.

As described above, the insulating layer 524 can include an excess-oxygen region. In that case, the insulating layer 522 preferably has a function of inhibiting diffusion of oxygen (e.g., an oxygen atom, an oxygen molecule, and the like) (through which the above is unlikely to pass).

When the insulating layer 522 has a function of inhibiting diffusion of oxygen and impurities, diffusion of oxygen contained in the oxide 530 to the insulating layer 520 side can be inhibited. Furthermore, the conductive layer 503 can be inhibited from reacting with oxygen contained in the insulating layer 524 or the oxide 530.

The insulating layer 522 is preferably a single layer or stacked layers using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST). As miniaturization and high integration of transistors progress, a problem such as leakage current might arise because of a thinner gate insulating film. When a high-k material is used for an insulator functioning as the gate insulating film, a gate potential at the time of driving the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulating layer 522 is formed using such a material, the insulating layer 522 functions as a layer that inhibits release of oxygen from the oxide 530 and entry of impurities such as hydrogen from the periphery of the transistor 500 into the oxide 530.

Aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulating layer 520 be thermally stable. For example, silicon oxide and silicon oxynitride, which have thermal stability, are suitable. Furthermore, when an insulator that is a high-k material is combined with silicon oxide or silicon oxynitride, the insulating layer 520 having a stacked-layer structure that has thermal stability and a high relative permittivity can be obtained.

In the transistor 500 in FIG. 16B and FIG. 16C, the insulating layer 520, the insulating layer 522, and the insulating layer 524 are illustrated as the second gate insulating film having a three-layer structure; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

Structure Example_3 of Transistor

Figure 17A:
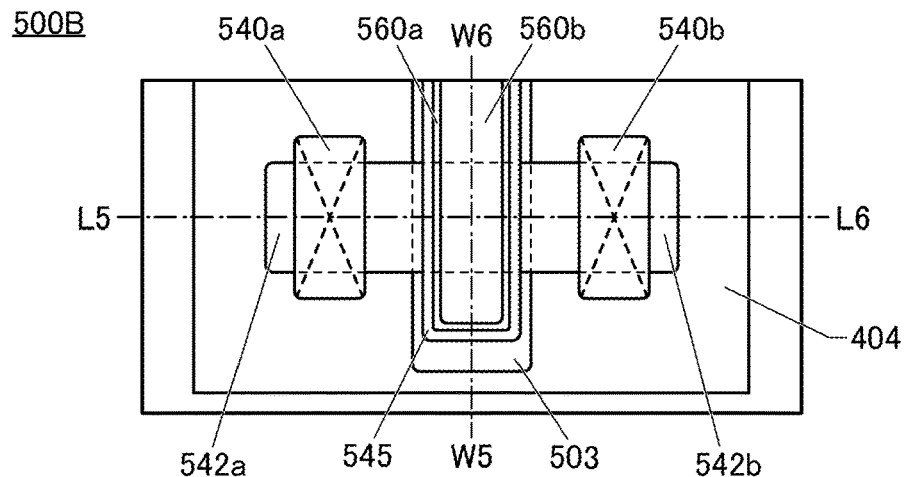
FIG. 17A to FIG. 17C are diagrams illustrating a structure example of a transistor.
Figure 17B:
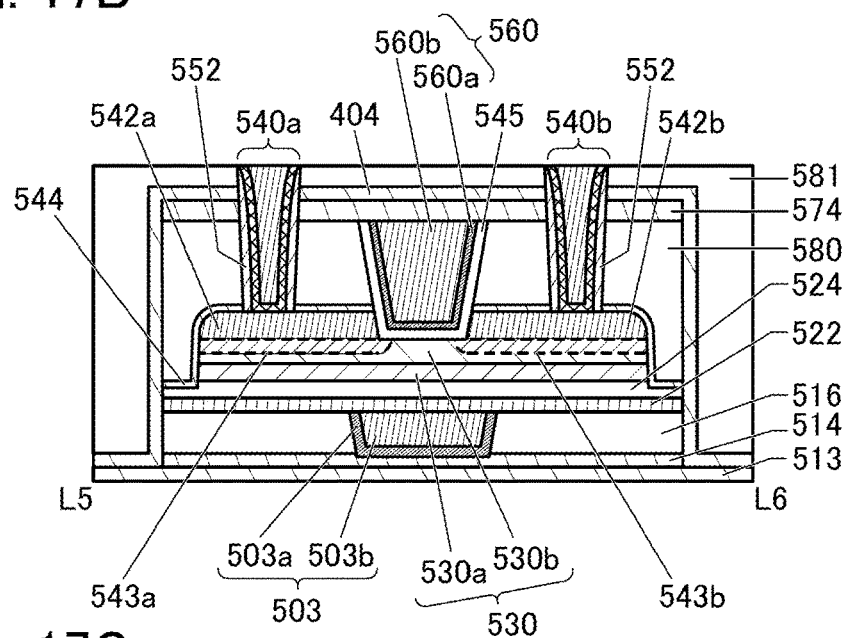
Figure 17C:
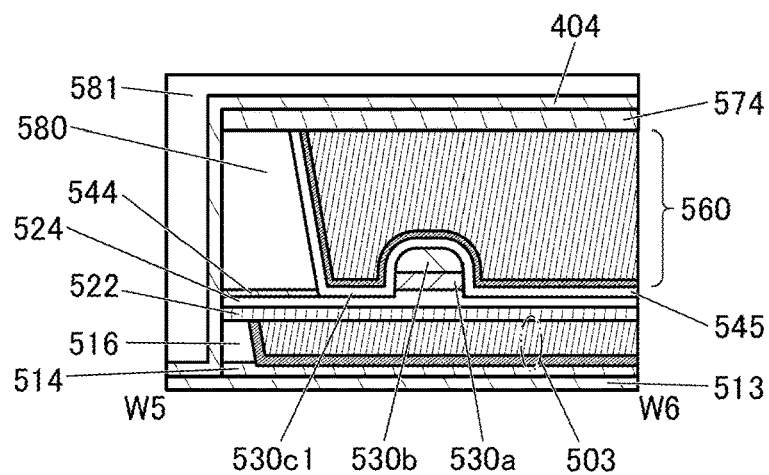

FIG. 17A, FIG. 17B, and FIG. 17C are diagrams illustrating a structure example of a transistor 500B, which is a modification example of the transistor 500A. FIG. 17A is a top view of the transistor 500B. FIG. 17B is a cross-sectional view of a portion indicated by a dashed-dotted line L5-L6 in FIG. 17A, and is a cross-sectional view in the channel length direction of the transistor 500B. FIG. 17C is a cross-sectional view of a portion indicated by a dashed-dotted line W5-W6 in FIG. 17A, and is a cross-sectional view in the channel width direction of the transistor 500B. Note that for clarity of the drawing, some components are not illustrated in the top view in FIG. 17A.

The transistor 500B is different from the transistor 500A in including an insulating layer 552, an insulating layer 513, and an insulating layer 404. The transistor 500B is different from the transistor 500A also in that the insulating layer 552 is provided in contact with a side surface of the conductive layer 540a and a side surface of the conductive layer 540b. Furthermore, the transistor 500B is different from the transistor 500A also in not including the insulating layer 520.

In the transistor 500B, the insulating layer 513 is provided over a substrate (not illustrated). In addition, the insulating layer 404 is provided over the insulating layer 574 and the insulating layer 513.

The transistor 500B has a structure in which the insulating layer 514, the insulating layer 516, the insulating layer 522, the insulating layer 524, the insulating layer 544, the insulating layer 580, and the insulating layer 574 are patterned and covered with the insulating layer 404. That is, the insulating layer 404 is in contact with a top surface of the insulating layer 574, a side surface of the insulating layer 574, a side surface of the insulating layer 580, a side surface of the insulating layer 544, a side surface of the insulating layer 524, a side surface of the insulating layer 522, a side surface of the insulating layer 516, a side surface of the insulating layer 514, and a side surface of the insulating layer 513. With such a structure, the oxide 530 and the like are isolated from the outside by the insulating layer 404 and the insulating layer 513.

The insulating layer 513 and the insulating layer 404 preferably have high capability of inhibiting diffusion of hydrogen (e.g., at least one of hydrogen atoms, hydrogen molecules, and the like) or water molecules. For example, the insulating layer 513 and the insulating layer 404 are preferably formed using silicon nitride or silicon nitride oxide with a high hydrogen barrier property. This can inhibit diffusion of hydrogen or the like into the oxide 530, thereby inhibiting degradation of the characteristics of the transistor 500B. Thus, the reliability of the semiconductor device of one embodiment of the present invention can be increased.

The insulating layer 552 is provided so as to have a region in contact with the insulating layer 581, the insulating layer 404, the insulating layer 574, the insulating layer 580, and the insulating layer 544. The insulating layer 552 preferably has a function of inhibiting diffusion of hydrogen or water molecules. For example, as the insulating layer 552, an insulator such as silicon nitride, aluminum oxide, or silicon nitride oxide that has a high hydrogen barrier property is preferably used. In particular, silicon nitride is suitably used for the insulating layer 552 because of its high hydrogen barrier property. The use of a material having a high hydrogen barrier property for the insulating layer 552 can inhibit diffusion of impurities such as water and hydrogen from the insulating layer 580 and the like into the oxide 530 through the conductive layer 540a or the conductive layer 540b.

Furthermore, oxygen contained in the insulating layer 580 can be inhibited from being absorbed by the conductive layer 540a and the conductive layer 540b. In this manner, the reliability of the semiconductor device of one embodiment of the present invention can be increased.

Structure Example_4 of Transistor

Figure 18A:
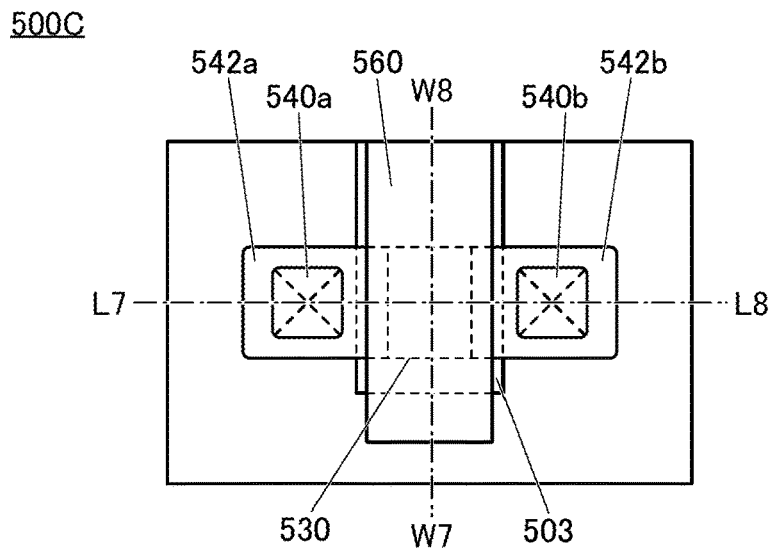
FIG. 18A to FIG. 18C are diagrams illustrating a structure example of a transistor.
Figure 18B:
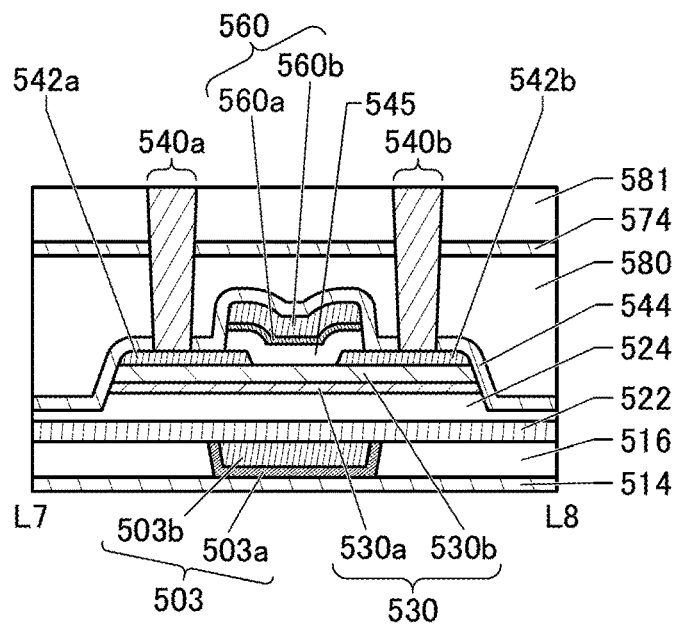
Figure 18C:
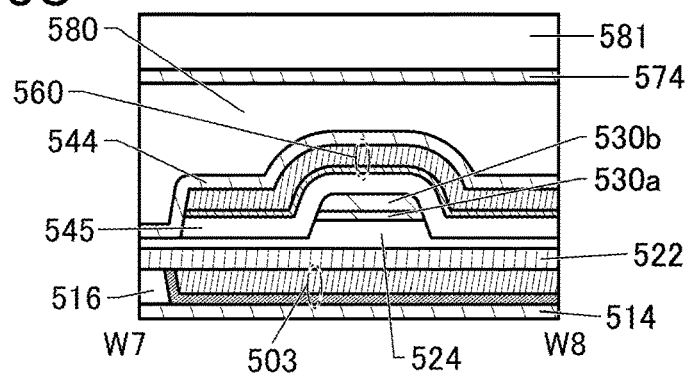

FIG. 18A, FIG. 18B, and FIG. 18C are diagrams illustrating a structure example of a transistor 500C, which is a modification example of the transistor 500. FIG. 18A is a top view of the transistor 500C. FIG. 18B is a cross-sectional view of a portion indicated by a dashed-dotted line L7-L8 in FIG. 18A, and is a cross-sectional view in the channel length direction of the transistor 500C. FIG. 18C is a cross-sectional view of a portion indicated by a dashed-dotted line W7-W8 in FIG. 18A, and is a cross-sectional view in the channel width direction of the transistor 500C. Note that for clarity of the drawing, some components are not illustrated in the top view in FIG. 18A.

The conductive layer 560 functioning as the first gate electrode includes the conductive layer 560a and the conductive layer 560b over the conductive layer 560a. The conductive layer 560a is preferably formed using a conductive material having a function of inhibiting diffusion of impurities such as a hydrogen atom, a hydrogen molecule, a water molecule, and a copper atom. Alternatively, the conductive layer 560a is preferably formed using a conductive material having a function of inhibiting diffusion of oxygen (e.g., at least one of oxygen atoms, oxygen molecules, and the like).

When the conductive layer 560a has a function of inhibiting diffusion of oxygen, oxidation of the conductive layer 560b can be inhibited even when a material that is easily oxidized is used for the conductive layer 560b. This can inhibit a decrease in the conductivity of the conductive layer 560.

The insulating layer 544 is preferably provided to cover the top surface and the side surface of the conductive layer 560 and the side surface of the insulating layer 545. Note that the insulating layer 544 is preferably formed using an insulating material having a function of inhibiting diffusion of oxygen and impurities such as water and hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulating layer 544 can inhibit the oxidation of the conductive layer 560. In addition, the insulating layer 544 can inhibit diffusion of impurities such as water and hydrogen contained in the insulating layer 580 into the transistor 500C.

The transistor 500C has the conductive layer 560 overlapping with part of the conductive layer 542a and part of the conductive layer 542b and thus tends to have larger parasitic capacitance than the transistor 500. Thus, the transistor 500C tends to have a lower operation frequency than the transistor 500. However, the transistor 500C does not require a step of embedding the conductive layer 560, the insulating layer 545, and the like in the opening formed in the insulating layer 580 and the like; thus, the productivity of the transistor 500C is higher than that of the transistor 500.

The configurations, structures, methods, and the like described in this embodiment can be used in combination as appropriate with the configurations, structures, methods, and the like described in the other embodiments.

Embodiment 3

In this embodiment, an oxide semiconductor that is a kind of metal oxide will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 19A. FIG. 19A is a diagram showing the classification of crystal structures of an oxide semiconductor, typically IGZO (a metal oxide containing In, Ga, and Zn).

As shown in FIG. 19A, an oxide semiconductor is roughly classified into "Amorphous", "Crystalline", and "Crystal". The term "Amorphous" includes completely amorphous. The term "Crystalline" includes CAAC (C-Axis-Aligned Crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame in FIG. 19A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 19B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 19B and obtained by GIXD measurement is hereinafter simply referred to as an XRD spectrum. The vertical axis and the horizontal axis in FIG. 19B represent intensity and 2θ, respectively. The CAAC-IGZO film in FIG. 19B has a composition in the vicinity of In:Ga:Zn=4:2:3 [atomic ratio]. The CAAC-IGZO film in FIG. 19B has a thickness of 500 nm.

As shown in FIG. 19B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 19B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 19C shows a diffraction pattern of the CAAC-IGZO film. FIG. 19C shows a diffraction pattern obtained with the NBED method in which an electron beam is incident in the direction parallel to the substrate. The composition of the CAAC-IGZO film in FIG. 19C is In:Ga:Zn=4:2:3 [atomic ratio] or the neighborhood thereof. In the nanobeam electron diffraction method, electron diffraction is performed with a probe diameter of 1 nm.

As shown in FIG. 19C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 19A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching driving can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The configurations, structures, methods, and the like described in this embodiment can be used in combination as appropriate with the configurations, structures, methods, and the like described in the other embodiments.

Embodiment 4

In this embodiment, structure examples of an imaging device for which the semiconductor device of one embodiment of the present invention can be used will be described with reference to drawings.

Figure 20A:
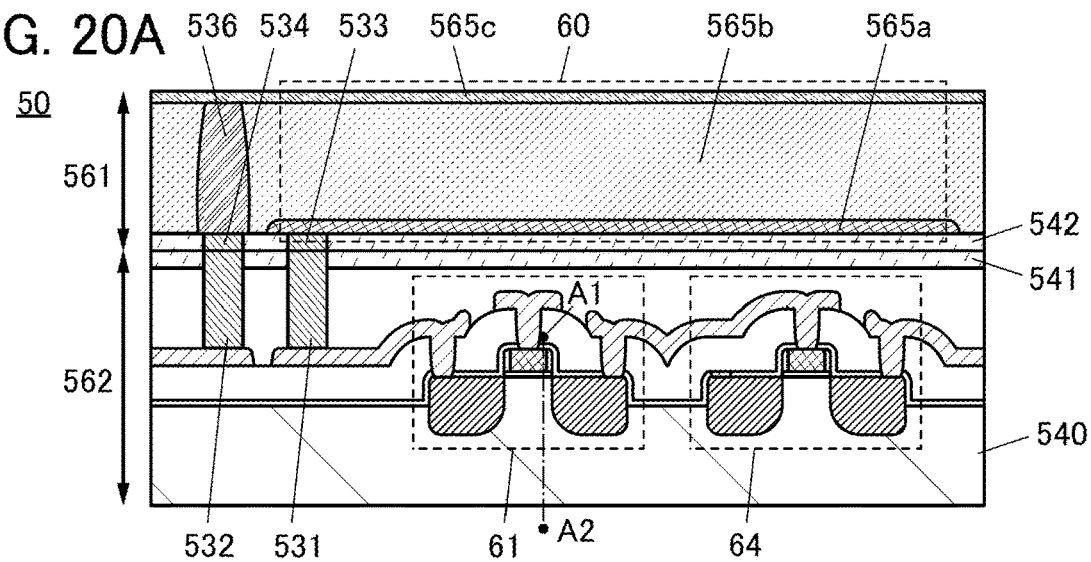
FIG. 20A to FIG. 20D are cross-sectional views showing structure examples of an imaging device.

FIG. 20A is a cross-sectional view illustrating a structure example of the imaging device for which the semiconductor device of one embodiment of the present invention can be used. Specifically, FIG. 20A illustrates cross-sectional structure examples of the photoelectric conversion device 60, the transistor 61, and the transistor 64, which are included in the components of the pixel circuit 50 illustrated in FIG. 13A. FIG. 20A illustrates an example in which the pixel circuit 50 has a stacked-layer structure of a layer 561 and a layer 562.

The layer 561 includes the photoelectric conversion device 60. The photoelectric conversion device 60 can include a stack of a layer 565a, a layer 565b, and a layer 565c. The layer 565b includes a region 536 for electrically connecting the layer 565c to wirings provided in the layer 562. For example, the region 536 can be a p$^+$-type region.

The photoelectric conversion device 60 illustrated in FIG. 20A is a pn-junction photodiode; for example, a p$^+$-type semiconductor can be used for the layer 565a, an n-type semiconductor can be used for the layer 565b, and an n$^+$-type semiconductor can be used for the layer 565c. Alternatively, an n$^+$-type semiconductor may be used for the layer 565a, a p-type semiconductor may be used for the layer 565b, and a p$^+$-type semiconductor may be used for the layer 565c. Alternatively, a pin-junction photodiode in which the layer 565b is an i-type semiconductor may be used.

The above-described pn-junction photodiode or pin-junction photodiode can be formed using single crystal silicon. The pin-junction photodiode can also be formed using a thin film of amorphous silicon, microcrystalline silicon, polycrystalline silicon, or the like.

Figure 20B:
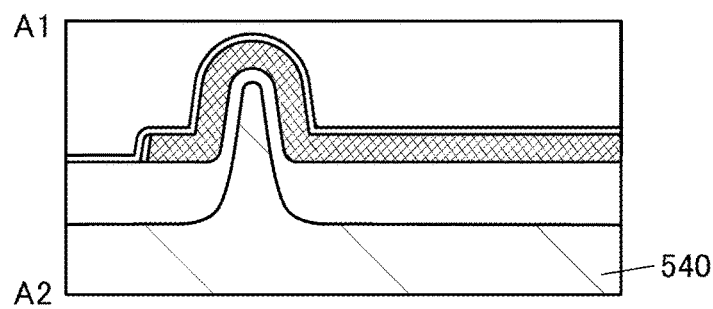
Figure 20C:
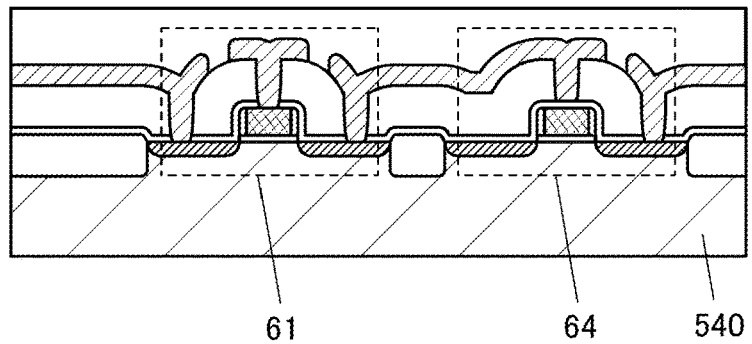

Si transistors are provided in the layer 562. The Si transistors illustrated in FIG. 20A each have a fin-type structure including a channel formation region in a silicon substrate 540, and FIG. 20B shows a cross section in the channel width direction. The Si transistors may each have a planar-type structure as illustrated in FIG. 20C.

Figure 20D:
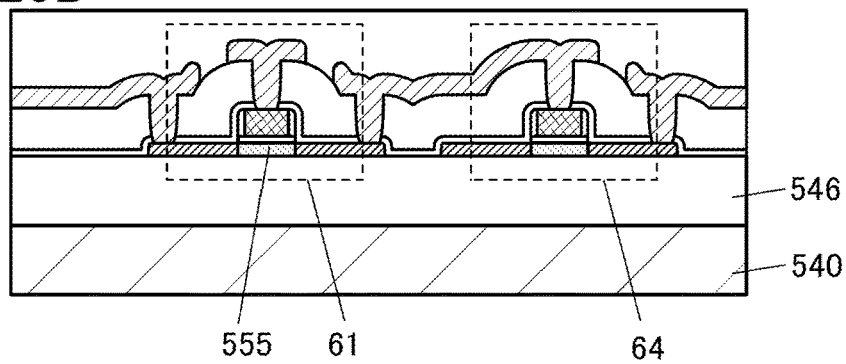

Alternatively, as illustrated in FIG. 20D, transistors each including a semiconductor layer 555 of a silicon thin film may be used. The semiconductor layer 555 can be single crystal silicon (SOI (Silicon on Insulator)) formed on an insulating layer 546 on the silicon substrate 540, for example.

FIG. 20A illustrates a structure example in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 531 is electrically connected to the source or the drain of the transistor 61. Furthermore, the surfaces of the insulating layer 541, the conductive layer 531, and the conductive layer 532 are planarized to have the same level.

Here, main components of the conductive layer 531 and the conductive layer 533 are preferably the same metal element. Main components of the conductive layer 532 and the conductive layer 534 are preferably the same metal element. Furthermore, the insulating layer 541 and the insulating layer 542 are preferably formed of the same component.

For example, for the conductive layer 531, the conductive layer 532, the conductive layer 533, and the conductive layer 534, Cu, Al, Sn, Zn, W, Ag, Pt, Au, or the like can be used. Preferably, Cu, Al, W, or Au is used for easy bonding. In addition, for the insulating layer 541 and the insulating layer 542, silicon oxide, silicon oxynitride, silicon nitride oxide, silicon nitride, titanium nitride, or the like can be used.

That is, the same metal material selected from the above is preferably used for the combination of the conductive layer 531 and the conductive layer 533, and the same metal material selected from the above is preferably used for the combination of the conductive layer 532 and the conductive layer 534. Furthermore, the same insulating material selected from the above is preferably used for the insulating layer 541 and the insulating layer 542. With this structure, bonding where a boundary between the layer 561 and the layer 562 is a bonding position can be performed.

This bonding enables electrical connection between the combination of the conductive layer 531 and the conductive layer 533 and between the combination of the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The configurations, structures, methods, and the like described in this embodiment can be used in combination as appropriate with the configurations, structures, methods, and the like described in the other embodiments.

Embodiment 5

In this embodiment, examples of an electronic device that can use the semiconductor device of one embodiment of the present invention will be described.

Examples of the electronic device that can use the semiconductor device of one embodiment of the present invention include display apparatuses, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. Specific examples of these electronic devices will be illustrated in FIG. 21A to FIG. 21F.

Figure 21A:
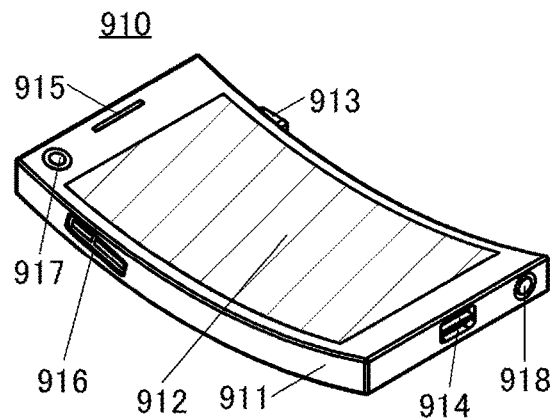
FIG. 21A to FIG. 21F are diagrams showing electronic devices.

FIG. 21A is an example of a cellular phone 910, which includes a housing 911, a display portion 912, an operation button 913, an external connection port 914, a speaker 915, a connector 916, a camera 917, an earphone jack 918, and the like. In the cellular phone 910, the display portion 912 can be provided with a touch sensor. All operations including making a call and inputting text can be performed by touching the display portion 912 with a finger, a stylus, or the like. In addition, a variety of removable memory devices such as a memory card, for example, an SD card, a USB memory, and an SSD (Solid State Drive), can be inserted in the connector 916.

The semiconductor device of one embodiment of the present invention can be used for the cellular phone 910. For example, an imaging device including the semiconductor device of one embodiment of the present invention can be used for a component such as the camera 917, which obtains imaging data in the cellular phone 910. Consequently, the cellular phone 910 can be reduced in size.

Figure 21B:
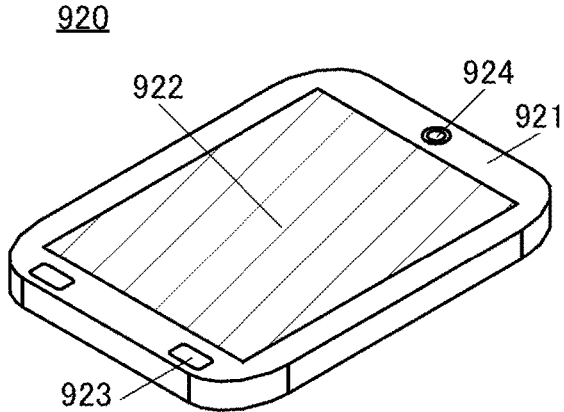

FIG. 21B is an example of a portable data terminal 920, which includes a housing 921, a display portion 922, a speaker 923, a camera 924, and the like. A touch panel function of the display portion 922 enables input and output of information. Furthermore, a character or the like in an image that is captured by the camera 924 can be recognized and the character can be voice-output from the speaker 923.

The semiconductor device of one embodiment of the present invention can be used for the portable data terminal 920. For example, an imaging device including the semiconductor device of one embodiment of the present invention can be used for a component such as the camera 924, which obtains imaging data in the portable data terminal 920. Consequently, the portable data terminal 920 can be reduced in size.

Figure 21C:
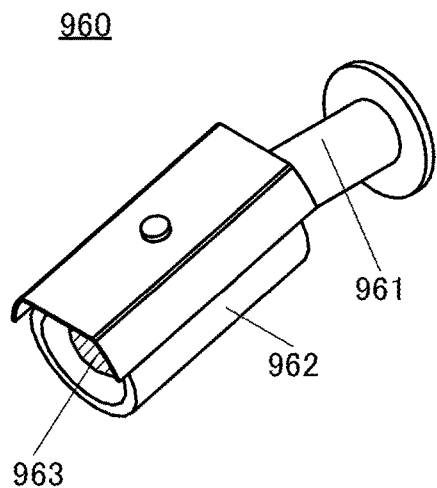

FIG. 21C is an example of a surveillance camera 960, which includes a fixture 961, a housing 962, a lens 963, and the like. The surveillance camera 960 can be mounted on a wall, a ceiling, or the like with the fixture 961. Note that a surveillance camera is a name in common use and does not limit the use thereof. A device that has a function of a surveillance camera can also be called a camera or a video camera, for example.

The semiconductor device of one embodiment of the present invention can be used for the surveillance camera 960. For example, an imaging device including the semiconductor device of one embodiment of the present invention can be used for a component that obtains imaging data in the surveillance camera 960. Consequently, the surveillance camera 960 can be reduced in size.

Figure 21D:
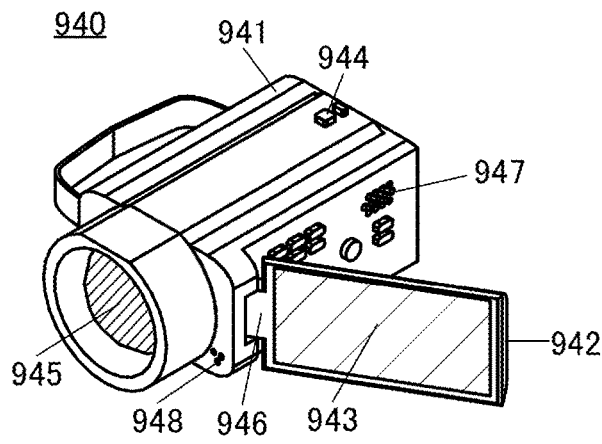

FIG. 21D is an example of a video camera 940, which includes a first housing 941, a second housing 942, a display portion 943, operation keys 944, a lens 945, a hinge 946, a speaker 947, a microphone 948, and the like. The operation keys 944 and the lens 945 can be provided in the first housing 941, and the display portion 943 can be provided in the second housing 942.

The semiconductor device of one embodiment of the present invention can be used for the video camera 940. For example, an imaging device including the semiconductor device of one embodiment of the present invention can be used for a component that obtains imaging data in the video camera 940. Consequently, the video camera 940 can be reduced in size.

Figure 21E:
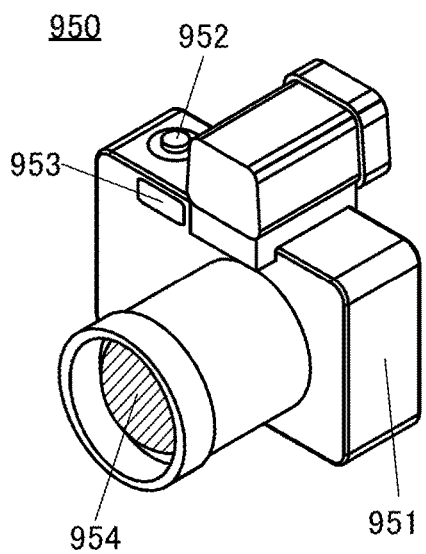

FIG. 21E is an example of a digital camera 950, which includes a housing 951, a shutter button 952, a light-emitting portion 953, a lens 954, and the like. The semiconductor device of one embodiment of the present invention can be used for the digital camera 950. For example, an imaging device including the semiconductor device of one embodiment of the present invention can be used for a component that obtains imaging data in the digital camera 950. Consequently, the digital camera 950 can be reduced in size.

Figure 21F:
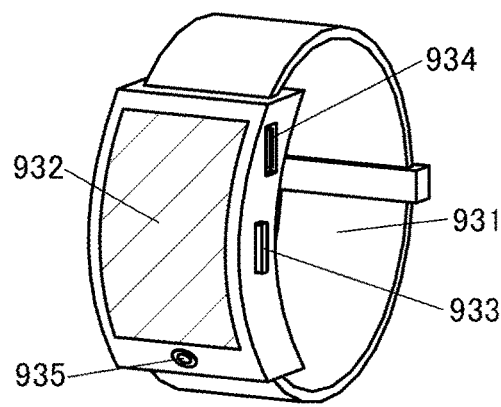

FIG. 21F is an example of a wristwatch-type information terminal 930, which includes a housing/wristband 931, a display portion 932, an operation button 933, an external connection port 934, a camera 935, and the like. The display portion 932 is provided with a touch panel for operating the information terminal 930. The housing/wristband 931 and the display portion 932 have flexibility and fit a body well.

The semiconductor device of one embodiment of the present invention can be used for the information terminal 930. For example, an imaging device including the semiconductor device of one embodiment of the present invention can be used for a component such as the camera 935, which obtains imaging data in the information terminal 930. Consequently, the information terminal 930 can be reduced in size.

The configurations, structures, methods, and the like described in this embodiment can be used in combination as appropriate with the configurations, structures, methods, and the like described in the other embodiments.

REFERENCE NUMERALS

10: semiconductor device, 11: transmission path, 20: circuit, 21: transistor, 22: transistor, 23: transistor, 24: capacitor, 30: circuit, 31: transistor, 32: transistor, 33: transistor, 34: capacitor, 40: circuit, 41: capacitor, 42: transistor, 50: pixel circuit, 60: photoelectric conversion device, 61: transistor, 62: transistor, 63: transistor, 64: transistor, 66: capacitor, 69: transistor, 71: period, 72: period, 73: period, 74: period, 75: period, 80: imaging device, 81: pixel portion, 82: gate driver circuit, 83: data driver circuit, 404: insulating layer, 500: transistor, 500A: transistor, 500B: transistor, 500C: transistor, 503: conductive layer, 503a: conductive layer, 503b: conductive layer, 513: insulating layer, 514: insulating layer, 516: insulating layer, 520: insulating layer, 522: insulating layer, 524: insulating layer, 530: oxide, 530a: oxide, 530b: oxide, 531: conductive layer, 532: conductive layer, 533: conductive layer, 534: conductive layer, 536: region, 540: silicon substrate, 540a: conductive layer, 540b: conductive layer, 541: insulating layer, 542: insulating layer, 542a: conductive layer, 542b: conductive layer, 543a: region, 543b: region, 544: insulating layer, 545: insulating layer, 546: insulating layer, 552: insulating layer, 555: semiconductor layer, 560: conductive layer, 560a: conductive layer, 560b: conductive layer, 561: layer, 562: layer, 565a: layer, 565b: layer, 565c: layer, 574: insulating layer, 580: insulating layer, 581: insulating layer, 910: cellular phone, 911: housing, 912: display portion, 913: operation button, 914: external connection port, 915: speaker, 916: connector, 917: camera, 918: earphone jack, 920: portable data terminal, 921: housing, 922: display portion, 923: speaker, 924: camera, 930: information terminal, 931: housing/wristband, 932: display portion, 933: operation button, 934: external connection port, 935: camera, 940: video camera, 941: housing, 942: housing, 943: display portion, 944: operation key, 945: lens, 946: hinge, 947: speaker, 948: microphone, 950: digital camera, 951: housing, 952: shutter button, 953: light-emitting portion, 954: lens, 960: surveillance camera, 961: fixture, 962: housing, 963: lens This application is based on Japanese Patent Application Serial No. 2019-217188 filed on Nov. 29, 2019, the entire contents of are hereby incorporated herein by reference.

The invention claimed is:

1. A semiconductor device comprising a first capacitor, a second capacitor, a first circuit and a second circuit,
   wherein the first circuit comprises first to n-th (n is an integer of 4 or more) transistors,
   wherein the second circuit comprises (n+1)-th to 2n-th transistors,
   wherein the semiconductor device further comprises a (2n+1)-th transistor, a (2n+2)-th transistor, a (2n+3)-th transistor, a (2n+4)-th transistor, a first output terminal and a second output terminal,
   wherein either sources or drains of the first to n-th transistors are electrically connected to each other,
   wherein one of a source and a drain of the (2n+1)-th transistor is electrically connected to ones of the sources or drains of the first to n-th transistors,
   wherein one terminal of the first capacitor is electrically connected to the ones of the sources or drains of the first to n-th transistors,
   wherein the one of the source and the drain of the (2n+1)-th transistor is electrically connected to the first output terminal,
   wherein others of the sources or drains of the first to n-th transistors are electrically connected to each other,
   wherein one of a source and a drain of the (2n+3)-th transistor is electrically connected to the others of the source or drains of the first to n-th transistors,
   wherein another terminal of the first capacitor is electrically connected to the other of the source and the drain of the (2n+3)-th transistor,
   wherein the other of the source and the drain of the (2n+3)-th transistor is electrically connected to a first wiring supplying to a first fixed potential,
   wherein a source and a drain of each of the (n+1)-th to 2n-th transistors are connected in series to each other,
   wherein one terminal of the second capacitor is electrically connected to the (n+1)-th transistor,
   wherein one of a source and a drain of the (2n+2)-th transistor is electrically connected to the (n+1)-th transistor,
   wherein the one of the source and the drain of the (2n+2)-th transistor is electrically connected to the second output terminal,
   wherein one of a source and a drain of the (2n+4)-th transistor is electrically connected to the 2n-th transistor,
   wherein another terminal of the second capacitor is electrically connected to the other of the source and the drain of the (2n+4)-th transistor,
   wherein the other of the source and the drain of the (2n+4)-th transistor is electrically connected to a second wiring supplying a second fixed potential,
   wherein a gate of the (2n+3)-th transistor is electrically connected to a gate of the (2n+4)-th transistor,
   wherein the first fixed potential is higher than the second fixed potential, wherein first to n-th signals are supplied to the first circuit and the second circuit, wherein the n-th signal is supplied to a gate of the n-th transistor and a gate of the 2n-th transistor, wherein the first circuit is configured to output a first potential when each of potentials of the first to n-th signals is lower than or equal to a first reference potential, wherein the first circuit is configured to output a second potential when at least one of the potentials of the first to n-th signals is higher than the first reference potential, wherein the second circuit is configured to output a third potential when each of the potentials of the first to n-th signals is higher than a second reference potential, and wherein the second circuit is configured to output the first potential when at least one of the potentials of the first to n-th signals is lower than or equal to the second reference potential.

2. The semiconductor device according to claim 1,
wherein the second potential is a potential corresponding to the first reference potential, and
wherein the third potential is a potential corresponding to the second reference potential.

3. The semiconductor device according to claim 1,
wherein the first to 2n-th transistors are n-channel transistors.

4. The semiconductor device according to claim 3,
wherein the second reference potential is lower than the first reference potential.

5. The semiconductor device according to claim 3,
wherein the second potential and the third potential are lower than the first potential.

6. The semiconductor device according to claim 3,
wherein the first to 2n-th transistors include a metal oxide in a channel formation region.

7. The semiconductor device according to claim 1,
wherein a gate of the (2n+1)-th transistor is electrically connected to a gate of the (2n+2)-th transistor,
wherein one of a source and a drain of the (2n+2)-th transistor is electrically connected to the second circuit,
wherein the second potential is supplied to the other of the source and the drain of the (2n+1)-th transistor, and
wherein the third potential is supplied to the other of the source and the drain of the (2n+2)-th transistor.

8. A driving method of a semiconductor device comprising:
a first circuit comprising first to n-th (n is an integer of 4 or more) transistors;
a second circuit comprising (n+1)-th to 2n-th transistors;
a (2n+1)-th transistor;
a (2n+2)-th transistor;
a (2n+3)-th transistor;
a (2n+4)-th transistor;
a first capacitor;
a second capacitor;
a first output terminal; and
a second output terminal,
wherein either sources or drains of the first to n-th transistors are electrically connected to each other,
wherein one terminal of the first capacitor is electrically connected to ones of the sources or drains of the first to n-th transistors,
wherein one of a source and a drain of the (2n+1)-th transistor is electrically connected to the ones of the sources or drains of the first to n-th transistors, wherein the one of the source and the drain of the (2n+1)-th transistor is electrically connected to the first output terminal,
wherein others of the sources or drains of the first to n-th transistors are electrically connected to each other,
wherein another terminal of the first capacitor is electrically connected to others of the sources or drains of the first to n-th transistors,
wherein a source and a drain of each of the (n+1)-th to 2n-th transistors are connected in series to each other,
wherein one terminal of the second capacitor is electrically connected to the (n+1)-th transistor,
wherein one of a source and a drain of the (2n+2)-th transistor is electrically connected to the (n+1)-th transistor,
wherein the one of the source and the drain of the (2n+2)-th transistor is electrically connected to the second output terminal,
wherein another terminal of the second capacitor is electrically connected to the 2n-th transistor,
wherein one of a source and a drain of the (2n+1)-th transistor is electrically connected to the first circuit,
wherein one of a source and a drain of the (2n+2)-th transistor is electrically connected to the second circuit,
wherein one of a source and a drain of the (2n+3)-th transistor is electrically connected to the first circuit, and
wherein one of a source and a drain of the (2n+4)-th transistor is electrically connected to the second circuit,
the method comprising the steps of:
supplying first to n-th signals to the first circuit and the second circuit,
supplying an i-th (i is 1 to n) signal to gates of an i-th transistor and the (n+i)-th transistor,
supplying a first potential to the other of the source and the drain of the (2n+1)-th transistor and the other of the source and the drain of the (2n+2)-th transistor,
supplying a second potential to the other of the source and the drain of the (2n+3)-th transistor,
supplying a third potential to the other of the source and the drain of the (2n+4)-th transistor,
in a first period, turning on the (2n+1)-th transistor and the (2n+2)-th transistor and turning off the (2n+3)-th transistor and the (2n+4)-th transistor, and
in a second period, turning off the (2n+1)-th transistor and the (2n+2)-th transistor and turning on the (2n+3)-th transistor and the (2n+4)-th transistor,
wherein the second potential is higher than the third potential, and
wherein the n-th signal is supplied to a gate of the n-th transistor and a gate of the 2n-th transistor.

9. The driving method of the semiconductor device according to claim 8,
wherein the first to 2n-th transistors are n-channel transistors.

10. The driving method of the semiconductor device according to claim 9,
wherein the third potential is lower than the second potential.

11. The driving method of the semiconductor device according to claim 9,
wherein the second potential and the third potential are lower than the first potential.

12. The semiconductor device according to claim 1,
wherein the first reference potential is larger than a difference of potentials of the one terminal and the other terminal of the first capacitor, and wherein the second reference potential is larger than a difference of potentials of the one terminal and the other terminal of the second capacitor.

13. The semiconductor device according to claim 1, wherein each of the other of the source and the drain of the (2n+1)-th transistor and the other of the source and the drain of the (2n+2)-th transistor is electrically connected to a third wiring supplying to a third fixed potential, and wherein the third fixed potential is higher than the first fixed potential.

14. The driving method of the semiconductor device according to claim 8, wherein the first potential is higher than the second potential.

* * * * *